United States Patent
Jeung et al.

(10) Patent No.: US 7,528,477 B2
(45) Date of Patent: *May 5, 2009

(54) CASTELLATION WAFER LEVEL PACKAGING OF INTEGRATED CIRCUIT CHIPS

(75) Inventors: Boon Suan Jeung, Singapore (SG); Chia Yong Poo, Singapore (SG); Low Siu Waf, Singapore (SG); Eng Meow Koon, Singapore (SG); Chua Swee Kwang, Singapore (SG); Huang Shuang Wu, Singapore (SG); Neo Yong Loo, Singapore (SG); Zhou Wei, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/221,539

(22) Filed: Sep. 7, 2005

(65) Prior Publication Data
US 2006/0001142 A1    Jan. 5, 2006

Related U.S. Application Data

(62) Division of application No. 11/182,427, filed on Jul. 14, 2005, now Pat. No. 7,271,027, which is a division of application No. 11/031,265, filed on Jan. 7, 2005, now Pat. No. 6,949,407, which is a division of application No. 10/233,149, filed on Aug. 28, 2002, now Pat. No. 6,855,572.

(51) Int. Cl.
*H01L 23/48* (2006.01)

(52) U.S. Cl. .................. 257/690; 257/730; 257/686; 257/777; 257/790; 257/E21.614; 257/E23.116; 257/E25.006

(58) Field of Classification Search ............ 257/685, 257/686, 777, 723, 789, 787–790, 793, 730, 257/690, 678, 731, 732, 733, E31.117, E31.118, 257/E31.119, E51.02, E23.116, E23.123, 257/E23.124, E25.006, E25.013, E25.018, 257/E25.027, E21.614, E23.085

See application file for complete search history.

(56) References Cited

U.S. PATENT DOCUMENTS 4,922,378 A    5/1990    Malhi et al.

(Continued)

OTHER PUBLICATIONS

Said F. Al-sarawi and Derek Abbott, *3D VLSI Packaging Technology*, The Univ. of Adelaide at, http://www.elecengadelaide.edu.au/Personal/alsarawi/Packaging/node17.html (Oct. 1997).

*Primary Examiner*—A. Sefer
*Assistant Examiner*—Dilinh P Nguyen
(74) *Attorney, Agent, or Firm*—Ropes & Gray LLP

(57) ABSTRACT

Systems and methods for packaging integrated circuit chips in castellation wafer level packaging are provided. The active circuit areas of the chips are coupled to castellation blocks and, depending on the embodiment, input/output pads. The castellation blocks and input/output pads are encapsulated and held in place by an encapsulant. When the devices are being fabricated, the castellation blocks and input/output pads are sawed through. If necessary, the wafer portion on which the devices are fabricated may be thinned. The packages may be used as a leadless chip carrier package or may be stacked on top of one another. When stacked, the respective contacts of the packages are preferably coupled. Data may be written to, and received from, packaged chips when a chip is activated. Chips may be activated by applying the appropriate signal or signals to the appropriate contact or contacts.

22 Claims, 17 Drawing Sheets

U.S. PATENT DOCUMENTS

| | | |
|---|---|---|
| 5,266,833 A | 11/1993 | Capps |
| 5,313,096 A | 5/1994 | Eide |
| 5,356,838 A | 10/1994 | Kim |
| 5,643,830 A | 7/1997 | Rostoker et al. |
| 5,834,162 A | 11/1998 | Malba |
| 6,117,765 A | 9/2000 | Kim et al. |
| 6,177,296 B1 | 1/2001 | Vindasius et al. |
| 6,372,623 B1 * | 4/2002 | Hoffman et al. ............ 438/613 |
| 6,391,685 B1 | 5/2002 | Hikita et al. |
| 6,410,859 B1 | 6/2002 | King |
| 6,614,103 B1 * | 9/2003 | Durocher et al. ............ 257/678 |
| 6,633,081 B2 * | 10/2003 | Sahara et al. ............... 257/738 |
| 6,727,116 B2 | 4/2004 | Poo et al. |
| 6,855,572 B2 | 2/2005 | Jeung et al. |
| 6,898,739 B2 | 5/2005 | Bucksch et al. |
| 6,949,407 B2 | 9/2005 | Jeung et al. |
| 7,012,326 B1 | 3/2006 | Wu et al. |
| 7,087,442 B2 | 8/2006 | Oppermann et al. |
| 7,193,312 B2 * | 3/2007 | Boon et al. ................. 257/690 |
| 2002/0096760 A1 | 7/2002 | Simelgor et al. |
| 2002/0096783 A1 | 7/2002 | Shen et al. |

* cited by examiner

CASTELLATION WAFER LEVEL PACKAGING OF INTEGRATED CIRCUIT CHIPS

CROSS-REFERENCE TO RELATED APPLICATION

This is a division of U.S. patent application Ser. No. 11/182,427 filed Jul. 14, 2005 which is a division of U.S. patent application Ser. No. 11/031,265, filed Jan. 7, 2005, which is a division of U.S. patent application Ser. No. 10/233,149 filed Aug. 28, 2002, now U.S. Pat. No. 6,855,572, all of which are hereby incorporated by reference herein in their entireties.

BACKGROUND OF THE INVENTION

This invention relates to systems and methods for packaging integrated circuit chips in castellation wafer level packaging. More particularly, this invention relates to castellation wafer level packaging that can be stacked on top of one another and alternatively can be used individually as leadless chip carriers.

Castellation wafer level packaging includes techniques for packaging chips in packaging slightly larger than the chips. The externally accessible contacts to the chips are the surfaces of solid blocks of conductive material. The solid blocks, referred to as castellation blocks or contacts, have notable length, width, and height dimensions relative to the packaging.

Techniques for packaging integrated circuit chips in packages that include castellation contacts are known. Such techniques include packaging chips in leadless chip carriers. These carriers can be easily placed into and taken out of devices that receive such carriers. Leadless chip carriers may also be soldered directly to, for example, a motherboard. Other known techniques of more densely packaging chips include packaging chips in three-dimensional arrays (i.e., chips stacked one on top of another).

These known techniques, however, have several drawbacks. One such drawback is the many steps required for depositing layers of materials for conduction and insulation. These techniques also require many steps for etching and connecting leads. Furthermore, these known techniques require internal leads (e.g., tape automated bonding ("TAB") leads) that couple the active circuit areas of the chips to the external castellation contacts of the packages. These internal leads are more susceptible to breaking or otherwise malfunctioning than larger, more rigid contacts that can be easily coupled to the active circuit areas via, for example, a trace line. In other words, these castellation contacts used with these known techniques are often mechanically unsound and not sturdy (e.g., they may move and break), thus causing undesired electrical discontinuities.

Furthermore, these packages are fabricated individually. That is, multiple packages are not known to be fabricated at the same time during the same process. Because only one package is fabricated at a time and each requires many steps of depositing and etching, the cost and time to fabricate a package is high.

Moreover, because only one package is fabricated at a time, the amount of materials used to fabricate the package is not used efficiently. The known techniques waste much of the materials used that could otherwise be used to fabricate multiple packages in the same process.

Another drawback of the known techniques is that the chips included in the packages are not well protected. That is, the chips are not protected by, for example, a passivation layer. In those cases where a protective material is incorporated into the package, that protective material is often suspended above the chip, which limits the protection. This is especially the case where internal leads are connected from the active circuit areas of the chips to the external contacts of the packages.

In view of the foregoing, it would be desirable to provide packaging for integrated circuit chips that can be stacked, used as a leadless chip carrier, and fabricated more than one at a time.

It would also be desirable to provide such packaging with large castellation contacts and chips that are well protected.

SUMMARY OF THE INVENTION

It is an object of the invention to provide packaging for integrated circuit chips that can be stacked, used as a leadless chip carrier, and fabricated more than one at a time.

It is also an object of the invention to provide such packaging with large castellation contacts and chips that are well protected.

In accordance with the invention, integrated circuit chips are packaged in castellation wafer level packaging. Multiple integrated circuit chips are fabricated on a wafer. The chips include active circuit areas and input/output chip pads (referred to hereinafter as "chip pads") coupled to the active circuit areas for inputting and outputting signals to and from the active circuit areas. The chips also preferably include a protective passivation layer deposited over the active circuit areas.

In a first embodiment of the invention, a passivation layer is deposited over the active circuit areas of the chips and the undeveloped portions of the wafer. The chip pads are left exposed such that conductors (e.g., trace lines) can be deposited from the chip pads to peripheral areas of the chips. Castellation blocks are deposited over the trace lines and preferably extend from an area over a first chip across an undeveloped portion of the wafer to an area over a second chip. This facilitates production of multiple packages. More than one package is preferably fabricated at one time.

The lengths of the castellation blocks preferably run perpendicular to the longitudinal edges of the chips on which they are distributed. The castellation blocks will be the electrical contacts for the packages. The castellation blocks are preferably large enough such that, for example, solder or "under bump material" (UBM) can be connected to the castellation blocks. Anisotropic conductive film (ACF) or anisotropic conductive paste (ACP) may also be connected to the castellation blocks in lieu of, or in conjunction with, solder or UBM. Preferably, an encapsulant is deposited over the wafer such that the castellation blocks are held in place and the rest of the packaging is protected (e.g., mechanically and electrically). The top-most surfaces of the castellation blocks are preferably not encapsulated. In alternative embodiments, the entire castellation block may be encapsulated. After the encapsulant is deposited, individual packages are separated from the devices being fabricated.

To separate the packages, a saw can be used to cut through the castellation blocks and encapsulant. Preferably, the castellation blocks are sawed through at the mid-points along their lengths and include at least some of the undeveloped portion of the wafer. If desired, the wafer may be entirely sawed through. In those applications in which volume is a significant consideration (e.g., architectures in which higher density packages are desired), the wafer may be thinned from the bottom (i.e., the undeveloped surface of the wafer) to the point where the wafer was sawed (i.e., to the kerf resulting from the sawing). The devices may first be sawed and then the wafer thinned, or the wafer may be thinned and then the devices sawed. The net result is packages separated from one another.

These packages have electrical contacts at the lateral faces of the castellation blocks and along the top surfaces of the castellation blocks where the encapsulant was not deposited. In other words, the area of the castellation blocks that were sawed through and the tops of the castellation blocks are the contacts to the packages. These contacts are coupled via conductors (e.g., trace lines) to the active circuit areas of the chips. The package may be advantageously used as a leadless chip carrier. That is, the contacts form conventional leadless chip carrier solder joints. To couple the contacts of the package to leadless chip carrier solder joints, the packages are preferably placed on, for example, a motherboard such that the active circuit areas of the chip are face down.

Packages fabricated via the first embodiment may alternatively be stacked. Packages are "sandwiched" between two printed circuit boards (PCBs). The inside faces (i.e., the sides of the PCBs facing the contacts of the packages) have conductors (contacts and trace lines) to which the contacts of the packages are soldered. The conductors are preferably coupled to, for example, a motherboard or some other suitable device that can transfer data to and from the chips in the packages. Each individual contact may be coupled to an individual trace line on a PCB. Alternatively, more than one contact may be coupled to the same trace line. In those embodiments, the same respective contacts of each package are preferably coupled together by the same trace line (e.g., the sixth contact of each chip is coupled to the same trace line).

To activate a chip (i.e., indicate that data is to be written to or read from a chip), an activation signal may be applied to the same contact of the packages. However, preferably only one chip will be activated by that signal via, for example, a unique pre-determined code. In another embodiment, activation signals may be applied to more than one contact. A chip may be activated in response to, for example, a binary code applied to the contacts designated for activation signals.

In a second embodiment of the invention, packages may also be stacked or used as leadless chip carriers depending on the application. When used as a leadless chip carrier, these packages may be placed on, for example, a motherboard such that the active circuit areas of the chip are face up or face down. These packages are also typically more compact than the packages of the first embodiment. Additional PCBs are not required when these packages are stacked.

In the second embodiment, chips are previously fabricated on a first wafer. On a second wafer, metal contacts are deposited. These metal contacts will be input/output pads for the packages and will be coupled to castellation blocks which will also provide input/output contacts. The metal contacts are distributed on the wafer in rows such that the chips may be placed between them.

After the metal contacts are deposited, castellation blocks are deposited on top of the metal contacts. A wafer adhesive is then placed over the wafer and over any exposed portion of the metal contacts. The chips from the first wafer are then deposited on the second wafer between the rows of contacts. The wafer adhesive holds the chips in place on the second wafer.

Once the chips are deposited on the second wafer, an encapsulant is deposited. The encapsulant is deposited such that the top surface of the encapsulant is level with the faces of the chips and preferably slightly below the level of the faces of the castellation blocks. The encapsulant is deposited to hold the castellation blocks in place. After the encapsulant is deposited, a passivation layer is deposited over the chips and the encapsulant (the chip pads of the active circuits are preferably left exposed or are exposed in a subsequent step of the fabrication process). Metal trace lines are deposited from the castellation blocks to the chip pads of the active circuits. The passivation layer is preferably substantially even with the level of the faces of the castellation blocks such that the electrical characteristics of the trace lines are more reliable.

After the trace lines are deposited, a final passivation layer is preferably deposited. The final passivation layer protects the chips and the trace lines coupling the castellation blocks to the active circuit areas of the chips. The final passivation layer is deposited such that there are exposures over a portion of the castellation blocks or, alternatively, portions of the final passivation layer over the castellation blocks are subsequently exposed.

The second wafer on which the devices are fabricated is preferably thinned such that the input/output pads are exposed. Alternatively, the second wafer may be etched such that the input/output pads are exposed. Either way, signals may be conducted from the bottoms of the devices to the tops of the devices and to the active circuit areas of the chips. In those applications in which the packages of the second embodiment are to be used (e.g., architectures in which higher density devices are important), it is preferred that the second wafer be entirely thinned.

To separate individual packages from the devices being fabricated, the encapsulant and castellation blocks are sawed through. It is preferred that the castellation blocks be sawed through at the mid-points along their lengths. The result is packages separated from one another.

The resultant packages have contacts as follows: at the lateral faces of the castellation blocks, along the tops of the castellation blocks where the exposures in the final passivation layer are present, and at the input/output pads. The castellation blocks are preferably large enough such that, for example, solder or UBM can be connected to the castellation blocks. Anisotropic conductive film (ACF) or anisotropic conductive paste (ACP) may also be connected to the castellation blocks in lieu of, or in conjunction with, solder or UBM. The contacts are coupled through the conductors (e.g., trace lines) to the active circuit areas of the chips. These packages may be used as leadless chip carriers in which the contacts may be used to form conventional leadless chip carrier solder joints.

The packages fabricated in the second embodiment may also be stacked. The input/output pads and the castellation blocks of a first package may be soldered to, for example, conductors on a motherboard or some other suitable device that can write data to and receive data from the chips in the packages. The input/output pads and the castellation blocks may be soldered directly to a motherboard or to contact pads coupled to a motherboard.

A second package may be stacked on top of the first package by soldering the tops of the castellation blocks where the exposures in the final passivation layer are present to the respective input/output pads on the bottom of the second package. More packages can be similarly stacked on top of these packages. Because the respective castellation blocks and input/output pads of each stacked package are coupled by solder, a signal applied to one contact (i.e., an input/output pad and a castellation block collectively) is applied to the contacts coupled to that contact.

Chips included in packages fabricated in the second embodiment are preferably activated in the same way as chips included in packages fabricated in the first embodiment. That is, each chip may be activated only if there is a signal on a specified contact or contacts indicating that the chip should be activated (e.g., a binary signal or a pre-determined "code" or "key" signal). Alternatively, activation signals may be applied to more than one contact. A chip may be activated in response to, for example, a binary code applied to the contacts designated for activation signals.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
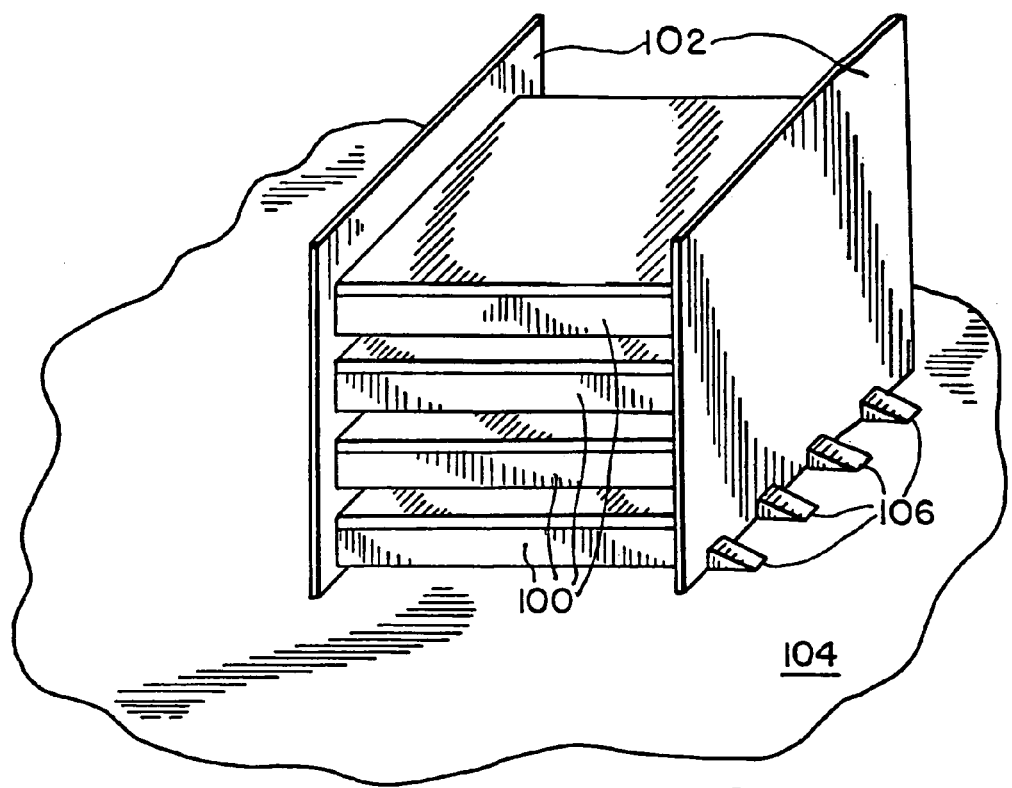
FIG. 1 illustrates a first embodiment of integrated circuit chip packaging in accordance with the invention.
Figure 2:
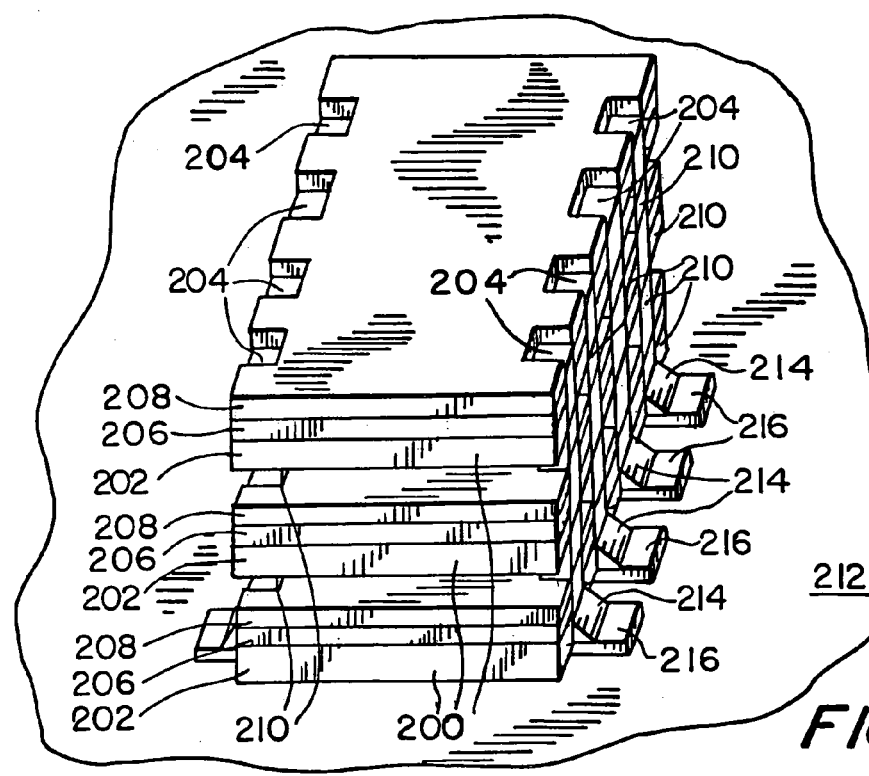
FIG. 2 illustrates a second embodiment of integrated circuit chip packaging in accordance with the invention.

FIGS. 1 and 2 illustrate preferred packages fabricated in accordance with the invention. In the embodiment shown in FIG. 1, packages 100 are stacked on top of one another. Contacts at the edge of the packages 100 (not shown) are soldered to printed circuit boards (PCB) 102. The contacts are coupled to the active circuit areas of integrated circuit chips in packages 100. Printed on PCBs 102 are conductors (not shown) coupling the respective contacts of each package 100. The contacts of packages 100 are also coupled to, for example, motherboard 104 by solder 106 which is coupled to the conductors printed on PCBs 102.

In the embodiment shown in FIG. 2, packages 200 are also stacked on top of one another. Each package 200 includes an integrated circuit chip (not shown) encapsulated by an encapsulant 202. Encapsulant 202 holds contacts 204 in place. Contacts 204 are coupled to the active circuit areas of the integrated circuit chip by conductors. Passivation interlayers 206 are deposited during fabrication to protect the integrated circuit chips, and passivation layers 208 are deposited to protect the conductors coupling contacts 204 to the active circuit areas of the integrated circuit chips in packages 200. Passivation layer 208 has exposures on the top of package 200 exposing the tops of contacts 204.

Coupled to the bottom of contacts 204 are input/output pads. Contacts 204 of a first package 200 are preferably coupled to the respective contacts 204 of a second package 200 stacked above the first package 200. This coupling is done by soldering the tops of contacts 204 of the first package 200 to the input/output pads of the respective contacts 204 of the second package 200. As shown, solder 210 couples the respective contacts 204 of each package 200. The stack of packages 200 may be coupled to, for example, motherboard 212 by coupling the input/output pads of the bottom-most package to motherboard 212 with solder 214. If desired, packages 200 may be mounted on pads 216 attached to motherboard 212.

The embodiments shown in FIGS. 1 and 2 and their fabrication are described in detail below in connection with FIGS. 3-13 and FIGS. 15-26, respectively. Transmitting information to and receiving information from packages fabricated in accordance with the invention is also described below in connection with these FIGS.

For clarity, the fabrication of only two packages is shown in the embodiments of FIGS. 3-13 and 15-26. More than two packages are preferably fabricated in each embodiment.

Figure 3:
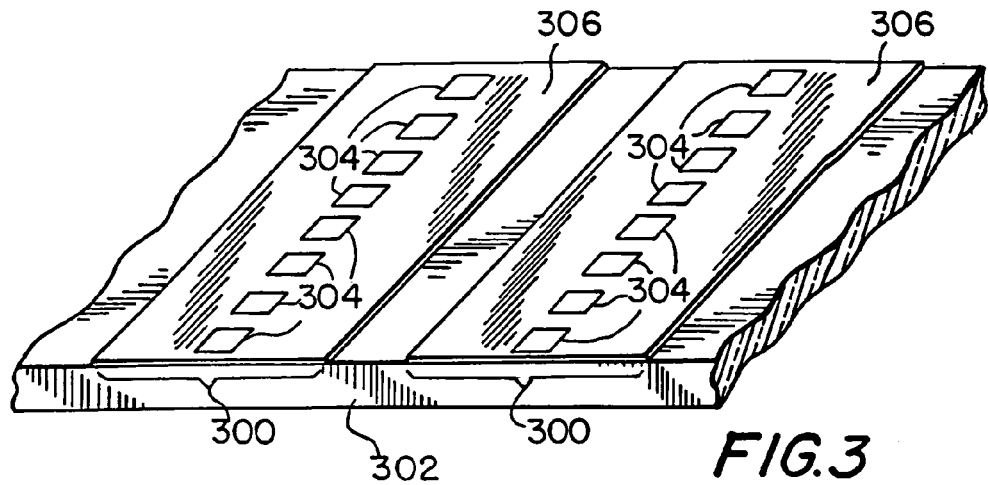
FIG. 3 illustrates two integrated circuit chips fabricated on a wafer.

FIG. 3 shows two integrated circuit chips 300 fabricated on wafer portion 302. Wafer portion 302 may be any suitable material on which integrated circuits can be fabricated such as silicon or gallium-arsenide. Chip pads 304 are coupled to the active circuit areas (not shown) of each chip 300. The active circuit areas are protected by a passivation layer 306. Passivation layer 306 may be, for example, $Si_3N_4$ or a polymer buffer coating suitable to protect the active circuit areas of chips 300.

Figure 4:
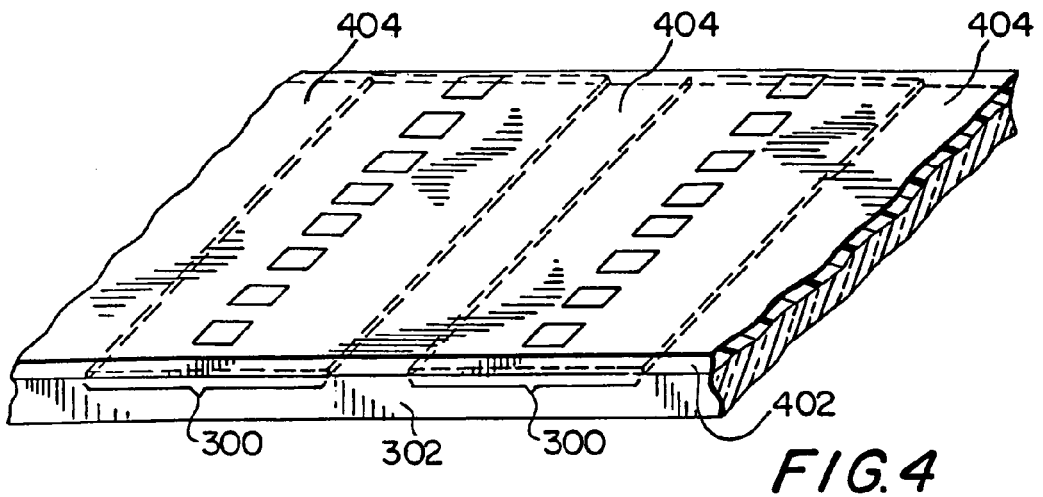
FIG. 4 illustrates a passivation interlayer applied to the chips of FIG. 3.

FIG. 4 shows passivation interlayer 402 deposited over wafer portion 302. Passivation interlayer 402 is preferably deposited over chips 300 and between-chip portions 404 of wafer portion 302 such that there is a substantially even layer over both wafer portion 302 and chips 300. Passivation interlayer 402 preferably has exposures exposing chip pads 304 of chips 300. Passivation interlayer 402 may be made of, for example, Benzocyclene (BCB) or polyimide.

Figure 5:
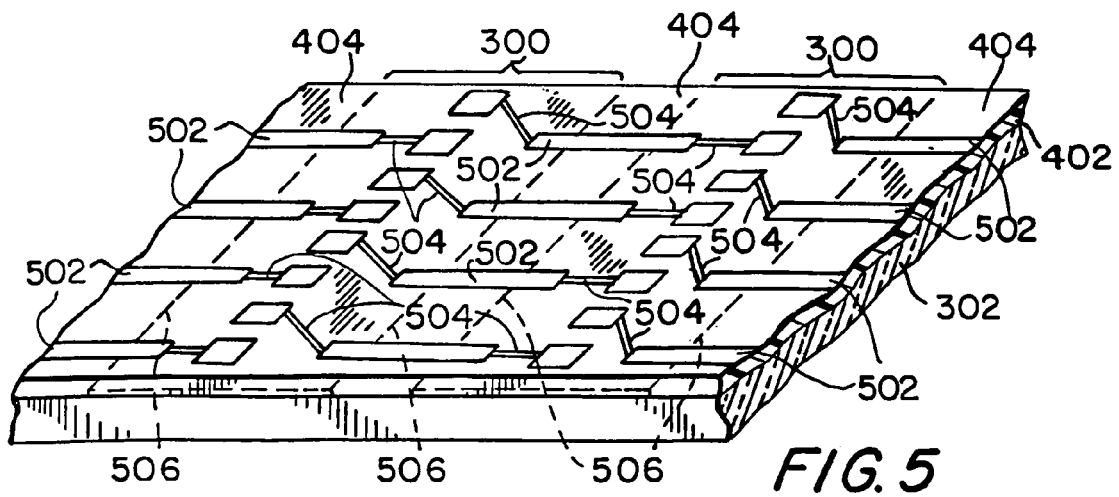
FIG. 5 illustrates contacts and conductors coupling the active circuit areas of the chips of FIG. 3.

FIG. 5 shows metal contacts 502 preferably deposited from an area above a first chip 300, across a portion 404, to an area above a second chip 300. Conductors 504 are also deposited such that contacts 502 and chip pads 304 are coupled. Conductors 504 may be deposited before, after, or simultaneously with metal contacts 502. Metal contacts 502 are preferably deposited such that they perpendicularly cross chip edges 506. Conductors 504 and contacts 502 may be aluminum, copper, UBM (under bump material), or any other suitable material. If contacts 502 are not made of UBM, UBM may be later deposited (not shown) over contacts 502 such that castellation blocks may be deposited on contacts 502.

Figure 6:
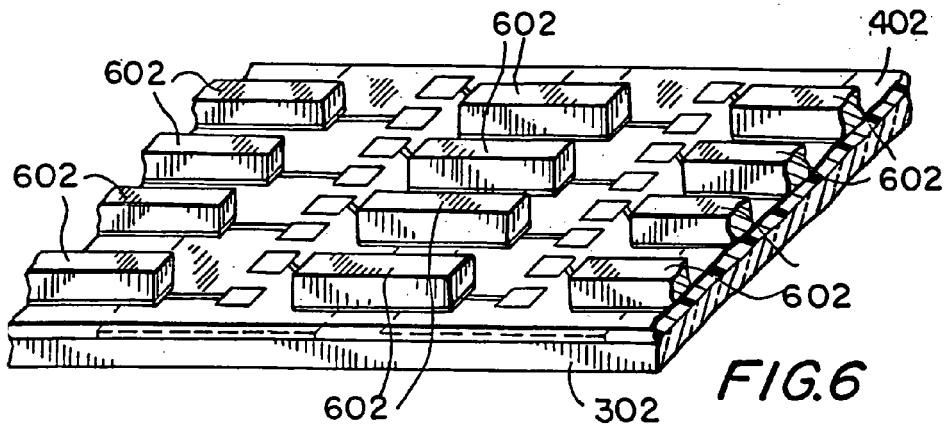
FIG. 6 illustrates castellation blocks deposited on the contacts of FIG. 5.

FIG. 6 illustrates castellation blocks 602 deposited on top of metal contacts 502. Metal contacts 502 and castellation blocks 602 may be deposited simultaneously. Castellation blocks 602 can be made of gold, copper, or any other metal or metal solution that remains solid during reflow of the under bump material on which castellation blocks 602 are deposited. Castellation blocks 602 are preferably high enough and wide enough such that contacts may be soldered to castellation blocks 602 after the packages encapsulating chips 300 are separated from one another. Anisotropic conductive film (ACF) or anisotropic conductive paste (ACP) may be used instead of, or in conjunction with, solder to provide electrical connection.

If desired, a final passivation layer (not shown in FIG. 6) may be deposited over the devices being fabricated to protect chip pads 304 (FIG. 3) and metal contacts 504 (FIG. 5). The final passivation layer is preferably not deposited over castellation blocks 602.

Figure 7:
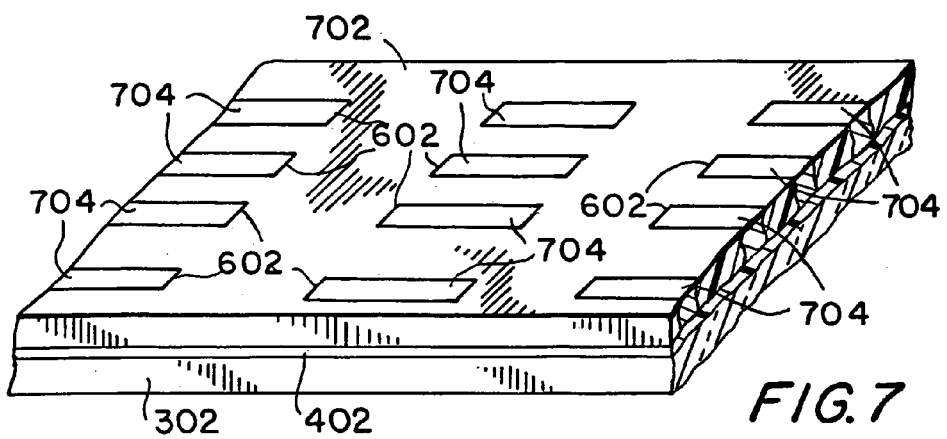
FIG. 7 illustrates an encapsulant deposited over the wafer of FIG. 6.

After castellation blocks 602 are deposited, they are supported and held in place by an encapsulant. This is illustrated in FIG. 7. Preferably, the top-most side 704 of castellation blocks 602 is not covered by encapsulant 702. Encapsulant 702 may be an epoxy mold compound, a liquid type epoxy, a liquid encapsulant, or any other encapsulant material such as SU-8. In any event, however, encapsulant 702 should preferably be a dielectric.

Figure 8:
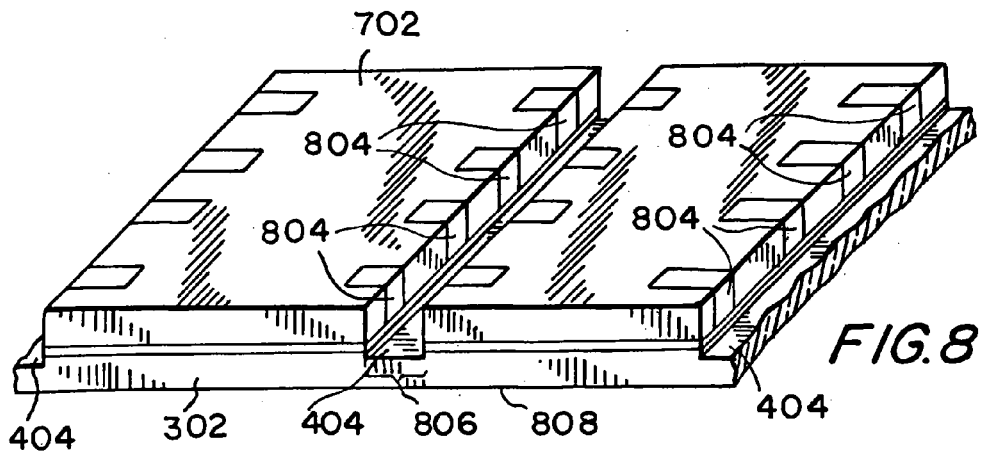
FIG. 8 illustrates a partial sawing through of the fabricated devices of FIGS. 3-7.

After depositing encapsulant 702, metal contacts 502 and castellation blocks 602 are cut where wafer portions 404 are present. Contacts 502 and blocks 602 may be cut using, for example, a saw (e.g., a dicing blade) or other machining techniques such as laser machining. FIG. 8 shows portions of encapsulant 702, metal contacts 502, and castellation blocks 602 that were sawed through, resulting in kerf 806 at between-chip portions 404. Faces 804 of castellation blocks 602 are now exposed.

To separate the devices into separate packages, wafer portion 302 may be completely sawed through at between-chip portions 404. Alternatively, wafer portion 302 may be thinned from side 808 of wafer portion 302 using any suitable wafer thinning technique. When wafer portion 302 is thinned to kerf 806, the devices can be separated.

Figure 9:
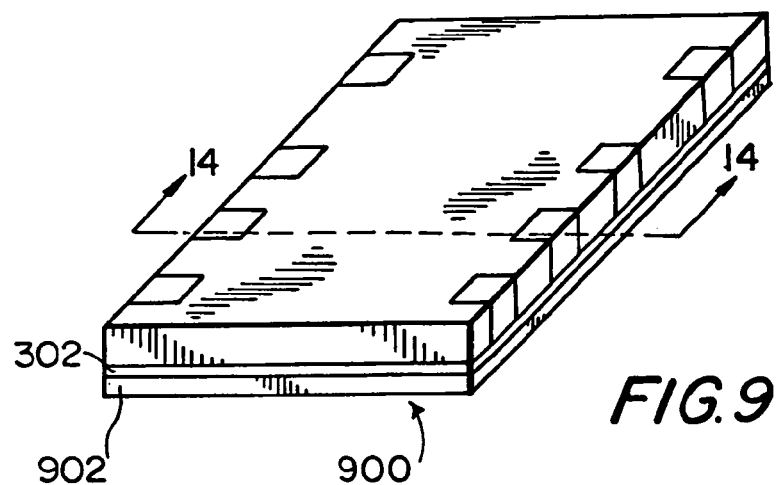
FIG. 9 illustrates an individual package with exposed contacts.

FIG. 9 illustrates a package 900 fabricated on a wafer portion 302 that was thinned and separated. For those applications requiring packages of as little volume as possible (e.g., stackable memory devices), wafer portions 302 of packages 900 are preferably thinned. Note that back passivation layer 902 may be deposited on the bottom of package 900 to protect the chip inside. Back passivation layer 902 may be a single layer coating of die back protection (such as those produced by Lintec Corporation of Japan) or a multi-layer laminate of die back protection (such as those produced by Nitto Denko of Japan).

Figure 10:
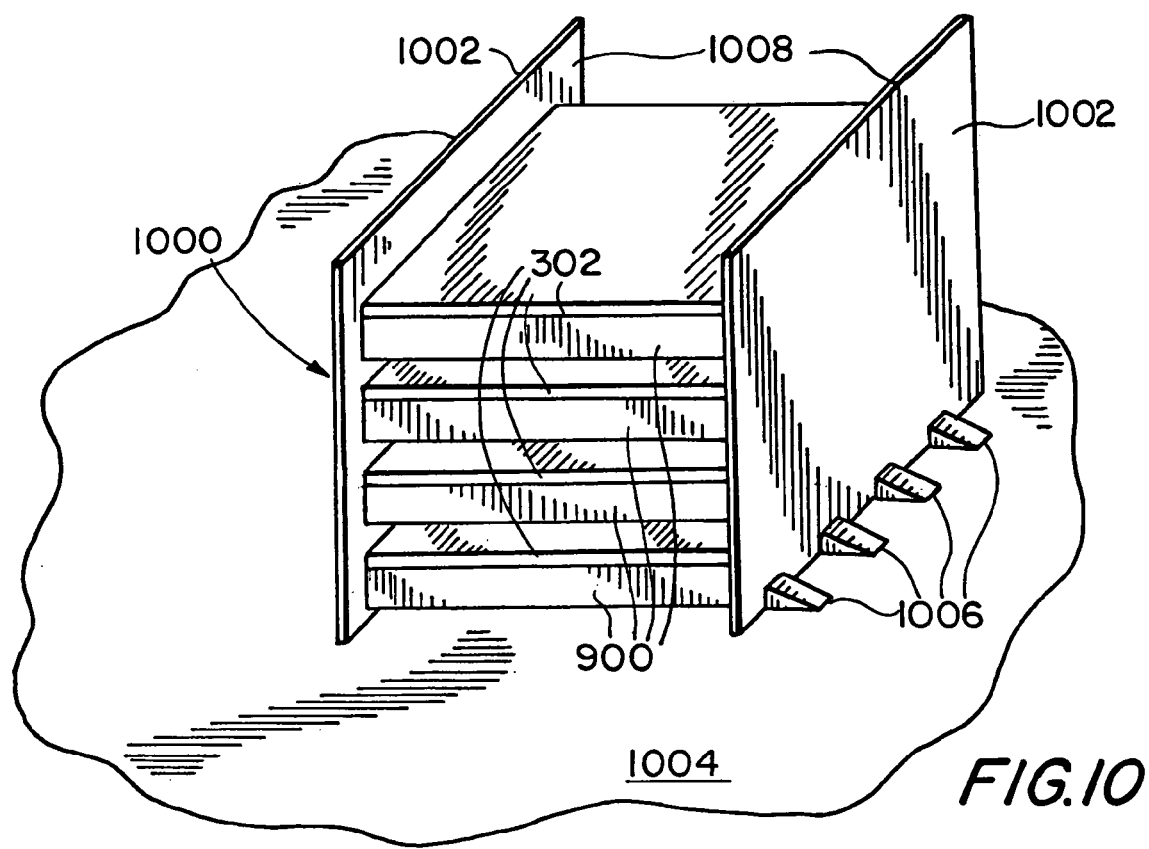
FIG. 10 illustrates packages of FIG. 9 stacked on top of one another.

Apart from their use as leadless chip carriers, packages 900 may also be used in embodiments in which the packages are stacked. In those embodiments, it may be preferable that wafer portions 302 are thinned such that packages 900 may be stacked more densely. As illustrated in FIG. 10, device 1000 comprises multiple packages 900 stacked on top of one another. As shown, wafer portions 302 of each package 900 are thinned.

The castellation blocks (not shown in FIG. 10) of each stacked package 900 are soldered to contacts 1102 (see FIGS. 11 and 12) on the inside faces 1008 of PCBs 1002 (i.e., the sides of PCBs 1002 facing the castellation blocks of packages 900). That is, packages 900 are "sandwiched" between two PCBs 1002. Printed on faces 1008 of PCBs 1002 are conductors 1104 (see FIGS. 11 and 12) coupling the respective contacts 1102 (and castellation blocks 602) of each package 900 to, for example, motherboard 1004 or some other suitable device that can transfer data to and from the chips in the packages. Motherboard 1004 is coupled to conductors 1104 by solder 1006.

Figure 11:
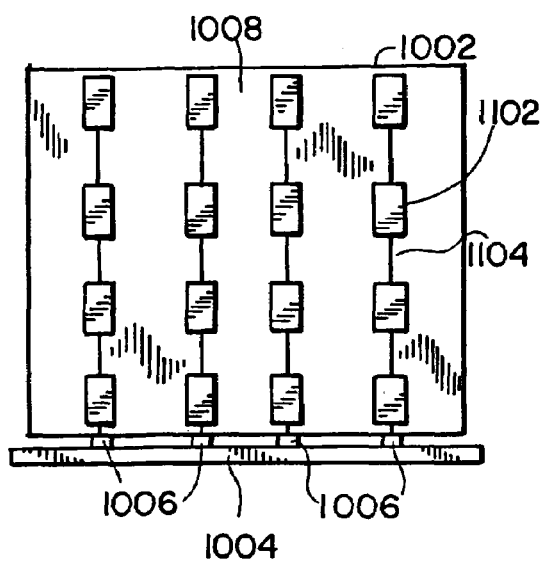
FIG. 11 is a plan view of a first embodiment of inside faces of printed circuit boards used in the stacking of packages shown in FIG. 9.
Figure 12:
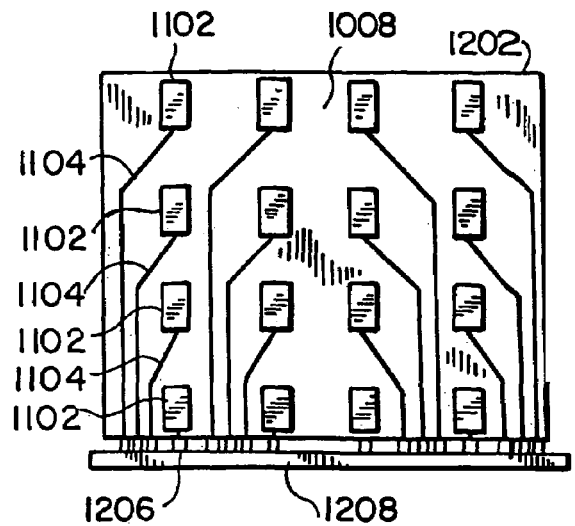
FIG. 12 is a plan view of a second embodiment of inside faces of printed circuit boards used in the stacking of packages shown in FIG. 9.

FIGS. 11 and 12 show respective embodiments of inside faces 1008 of printed circuit boards. Contacts 1102 are arranged such that the castellation blocks may be soldered to contacts 1102. Preferably, contacts 1102 are arranged such that they are spaced substantially the same distance from one another as are the castellation blocks of the packages. In the embodiments shown in FIGS. 11 and 12, the packages are to be stacked on top of one another. Conductors 1104 couple contacts 1102 to solder 1006, thus coupling the castellation blocks of the packages to motherboard 1004.

In FIG. 11 (an exemplary face 1008 of a PCB 1002 used in the embodiment shown in FIG. 10), conductors 1104 couple each column of contacts 1102 to one another (which are to be coupled to the respective castellation blocks) and to motherboard 1004 by solder 1006.

In FIG. 12, conductors 1104 do not couple contacts 1102 to one another. Instead, each contact 1102 is individually coupled to, for example, motherboard 1208 by conductors 1104. Conductors 1104 couple solder 1206 (which solders motherboard 1208 and PCB 1202) to contacts 1102.

Figure 13A:
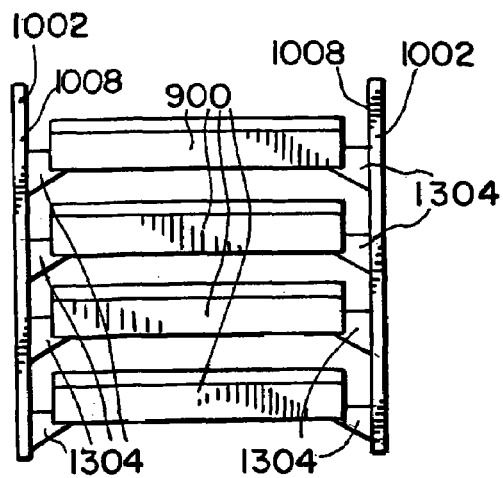
FIGS. 13A and B are side and plan views, respectively, of the stacked chips of FIG. 9.
Figure 13B:
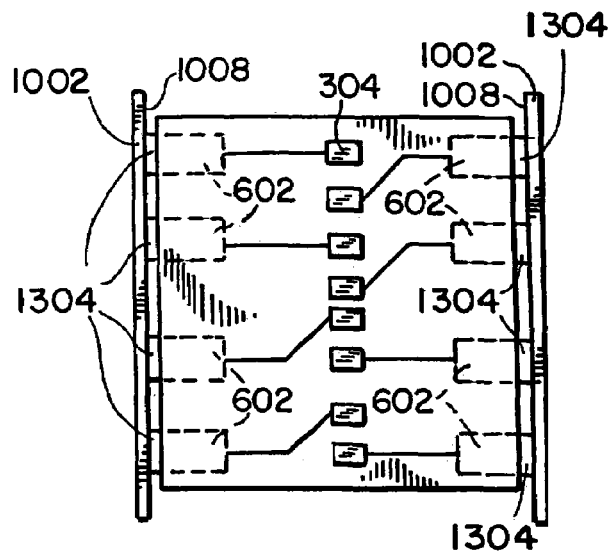

Side and top views of device 1000 are shown respectively in FIGS. 13A and B. Solder 1304 electrically couples conductors 1104 on the inside faces 1008 of PCBs 1002 to castellation blocks 602. This electrically couples the active circuit areas (at chip pads 304) of chips 300 packaged in packages 900 to, for example, motherboard 1004.

To write data to and read data from chips 300 (assuming chips 300 are memory chips), a chip 300 is activated. To activate a chip (i.e., indicating that data is to be written to or read from a chip), an activation signal is applied to the appropriate castellation blocks or groups of blocks (and in turn, to the appropriate portions of the chips). The castellation block or groups of blocks for activation may be unique to each chip.

If, for example, a chip is activated by an activation signal applied to a particular castellation block intended to activate that chip, that chip (and preferably only that chip) is activated.

In the embodiment shown in FIG. 12, each contact 1102 (and respective castellation block) has a separate associated conductor 1104. Information may be written to and read from each packaged chip simultaneously because each contact 1102 has an associated conductor 1104. However, the number of conductors 1104 from contacts 1102 to motherboard 1004 increases with each additional stacked package. Such additional conductors 1104 may increase the cost of fabrication and may cause complexities such as parasitic resistance and capacitance and unwanted noise in neighboring conductors 1104.

In contrast, each contact 1102 in FIG. 11 does not have a separate conductor 1104 connected directly to motherboard 1004. Instead, each contact 1102 is coupled to the other contacts 1102 in the same column. Moreover, all of the contacts 1102 in a row are coupled to the respective castellation blocks of the stacked packages. Although information cannot be written to and read from each stacked package simultaneously as in the case of the FIG. 12 embodiment, the number of conductors 1104 is reduced in the FIG. 11 embodiment.

To activate a chip in a package stacked between two PCBs 1002 (as is shown in the embodiment illustrated in FIGS. 10, 11, and 13), an activation signal is applied to a column of castellation blocks. In the simplest embodiment, a chip is activated only if an activation signal is applied to a dedicated castellation block for that particular chip. For example, if a signal on the dedicated castellation block for a package is high, the packaged chip is activated. As the dedicated castellation block of one package is coupled to castellation blocks of other packages, the high signal on those castellation blocks of the other packages preferably has no effect.

In another embodiment, all the stacked packages have the same castellation block dedicated to receive activation signals. A "code" or "key" signal is applied to the dedicated castellation blocks. Preferably only one of the chips in the stacked packages will be activated by the code or key signal. Each code or key signal is preferably unique to each chip. Code or key signals may also be used to de-activate chips. Such signals may include start and stop bits such that the chips can determine where the beginning and ending of the code or key signals are and whether the chips should become active or inactive or should ignore the signals.

In yet another embodiment, activation signals are applied to more than one castellation block. For example, a chip may be activated in response to a binary code of high and low activation signals. For example, a chip can be programmed (e.g., during the fabrication process) to become active (or inactive) in response to a high signal on a first castellation block and a low signal on a second castellation block.

The above examples are merely exemplary. Chips in stacked packages according to the embodiment of FIGS. 1 and 3-13 may be activated and de-activated and may have information written to them and retrieved from them in any suitable way.

Figure 14:
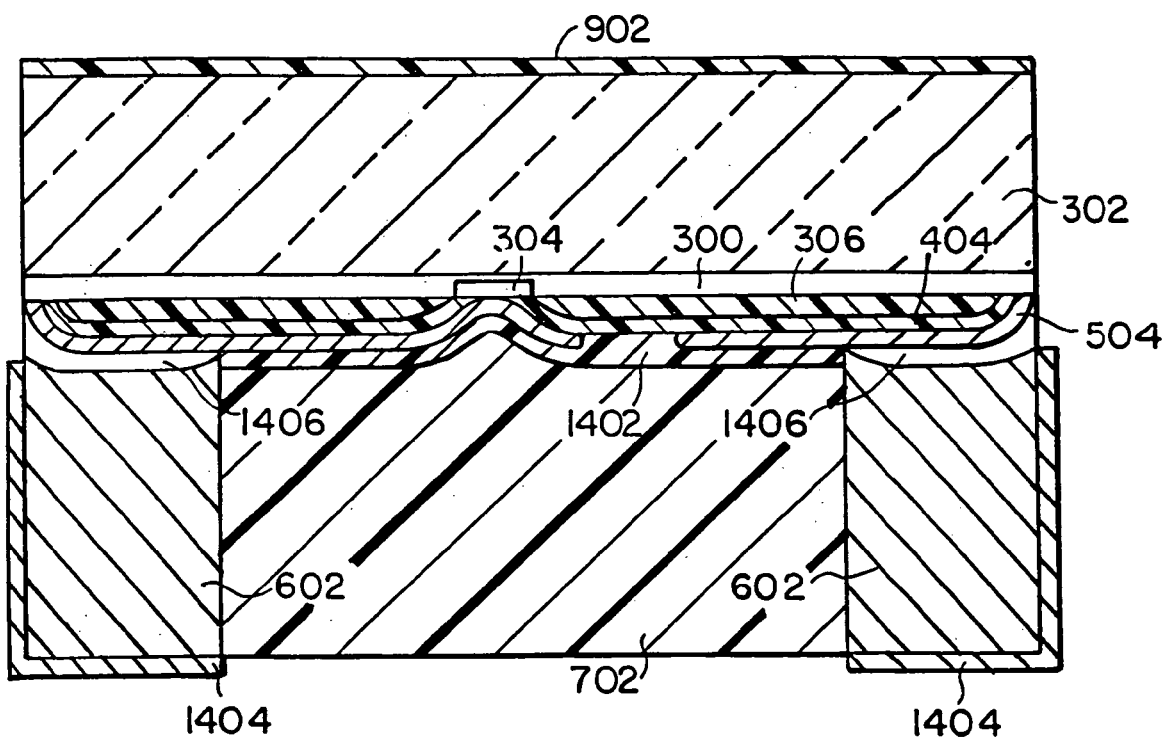
FIG. 14 illustrates a cross-sectional view of the chip illustrated in FIG. 9 taken along line 14-14 of FIG. 9.

FIG. 14 shows a cross-section of a package 900 through a chip pad 304 taken along line 14-14 shown in FIG. 9. Shown are wafer portion 302, the active circuit areas of chip 300, passivation layer 306, passivation interlayer 404, metal contacts 504, castellation blocks 602, encapsulant 702, a back passivation layer 902, a final passivation layer 1402, castellation contacts 1404, and UBM 1406.

As shown in FIG. 14, final passivation layer 1402 protects chip pads 304 and metal contacts 504. Final passivation layer 1402 may be made of polyimide or any other suitable material such as BCB.

Solder-wettable metal 1404 may be deposited on castellation blocks 602 to provide better solder joint reliability. This may be desirable in those embodiments in which package 900 will be surface mounted. Solder-wettable metal 1404 may be made of gold or any other suitable material that wets well to solder-paste prior to surface mount. Such a material may be tin. In those embodiments in which solder-wettable metal 1404 is deposited on castellation blocks 602, other metals (e.g., UBM) may be deposited on castellation blocks 602 to provide better adhesion, buffering, and isolation. The materials may also act as a diffusion barrier.

As stated previously and as shown in FIG. 14, UBM 1406 may be deposited on top of metal contacts 504 (if metal contacts 504 are not UBM) where castellation blocks 602 are present such that castellation blocks 602 may be deposited on contacts 502.

FIGS. 15-26 illustrate another preferred embodiment of the invention. This embodiment is also directed towards fabricating packages for integrated circuit chips that can be stacked if desired. Alternatively, these packages may be used individually as leadless chip carriers.

Figure 15:
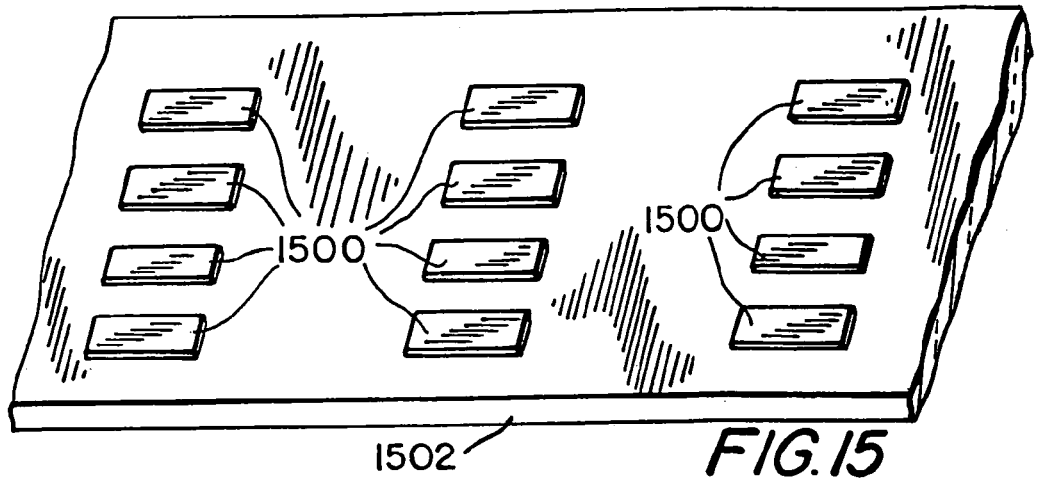
FIG. 15 illustrates input/output pads deposited on a wafer.
Figure 16:
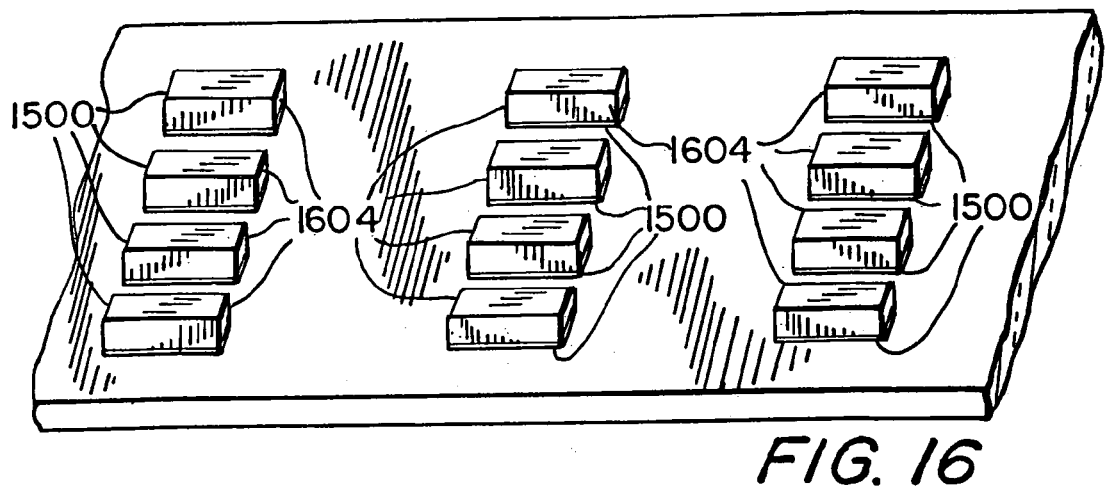
FIG. 16 illustrates castellation blocks deposited on top of the input/output pads of FIG. 15.

FIG. 15 shows metal contacts 1500 deposited on wafer portion 1502 (which may be, for example, silicon or gallium-arsenide). Metal contacts 1500 may be made of, for example, aluminum, copper, or under bump material. FIG. 16 shows castellation blocks 1604 deposited on top of contacts 1500. Castellation blocks 1604 may be, for example, gold, copper, or any other metal or metal solution that stays solid during reflow. Although castellation blocks 1604 are illustrated as having the same width and length dimensions as contacts 1500, blocks 1604 and contacts 1500 may have different dimensions and may be of other shapes, such as, for example, square, circular, or elliptical. Blocks 1604 and contacts 1500 may also be of shapes different from each other. For example, blocks 1604 may be circular (e.g., cylindrical columns or pillars) and contacts 1500 may be rectangular.

Figure 17:
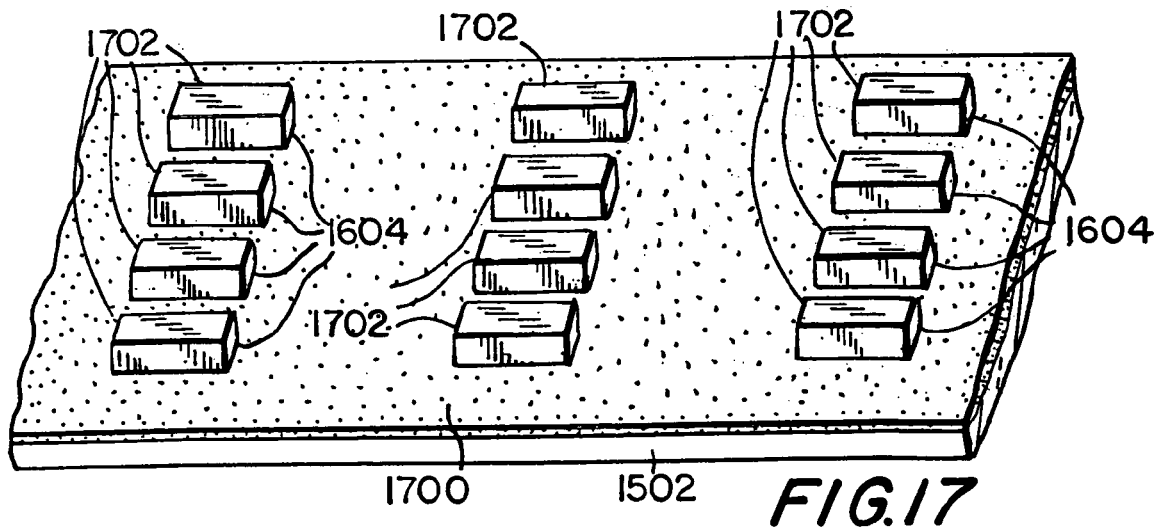
FIG. 17 illustrates a wafer adhesive deposited over the wafer of FIG. 15.

After contacts 1500 and castellation blocks 1604 are deposited on wafer portion 1502, a wafer adhesive 1700 is deposited over the devices being fabricated except for surfaces 1702 of blocks 1604, as shown in FIG. 17. Wafer adhesive 1700 may be BCB, polyimide, or any other suitable adhesive.

Figure 18:
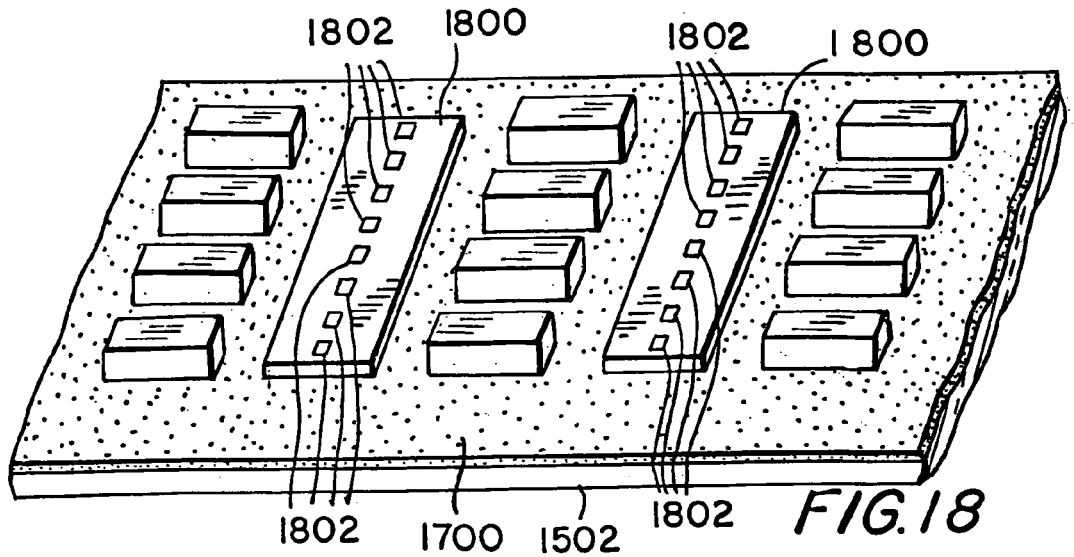
FIG. 18 illustrates integrated circuit chips deposited on the wafer of FIG. 15.

FIG. 18 shows integrated circuit chips 1800, which were previously fabricated on a wafer different than the wafer that includes wafer portion 1502, placed on wafer portion 1502 after wafer adhesive 1700 has been applied to wafer portion 1502. Note that, if desired, chips 1800 may be fabricated on the same wafer as wafer portion 1502. Each chip 1800 has active circuit areas (not shown) and chip pads 1802 coupled to the active circuit areas. A passivation layer with exposures at chip pads 1802 (also not shown in FIG. 18) is preferably deposited during the fabrication of chips 1800 to protect the active circuit areas of chips 1800. The passivation layer is preferably made of Si3N4 or a polymer buffer coating.

Figure 19:
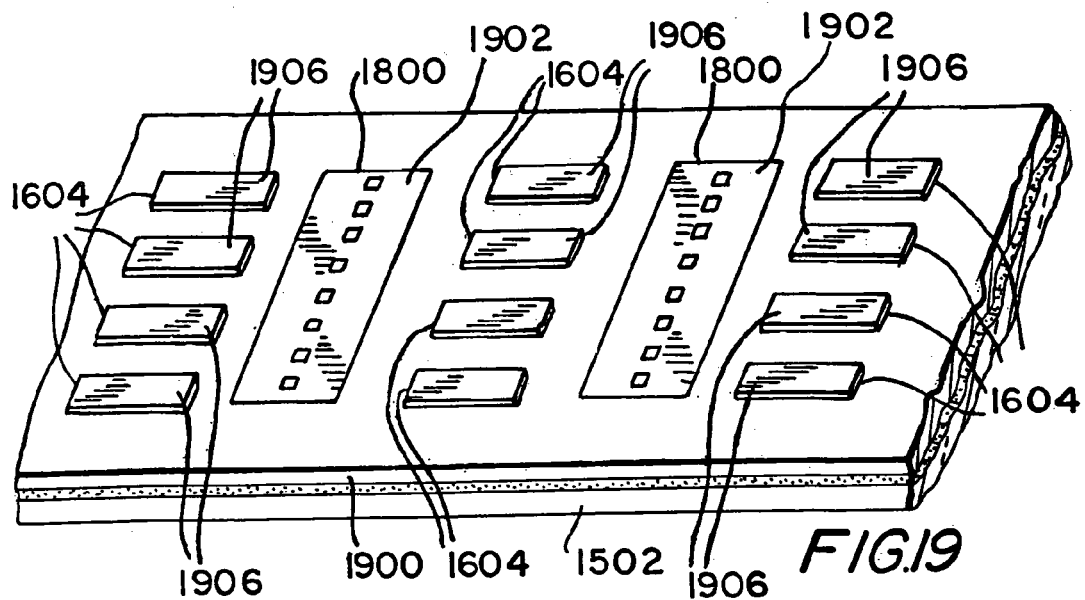
FIG. 19 illustrates an encapsulant deposited on the wafer of FIG. 15.

FIG. 19 shows encapsulant 1900 deposited over portion 1502 after chips 1800 have been placed on portion 1502. Encapsulant 1900 may be an epoxy molding compound, a liquid type epoxy, or any other encapsulant such as SU-8. Encapsulant 1900 is preferably not deposited over surfaces 1902 of chips 1800 nor surfaces 1906 of blocks 1604. Encapsulant 1900 is preferably deposited such that it is the same height as surfaces 1902 of chips 1800 and shorter in height than surfaces 1906 of blocks 1604.

Figure 20:
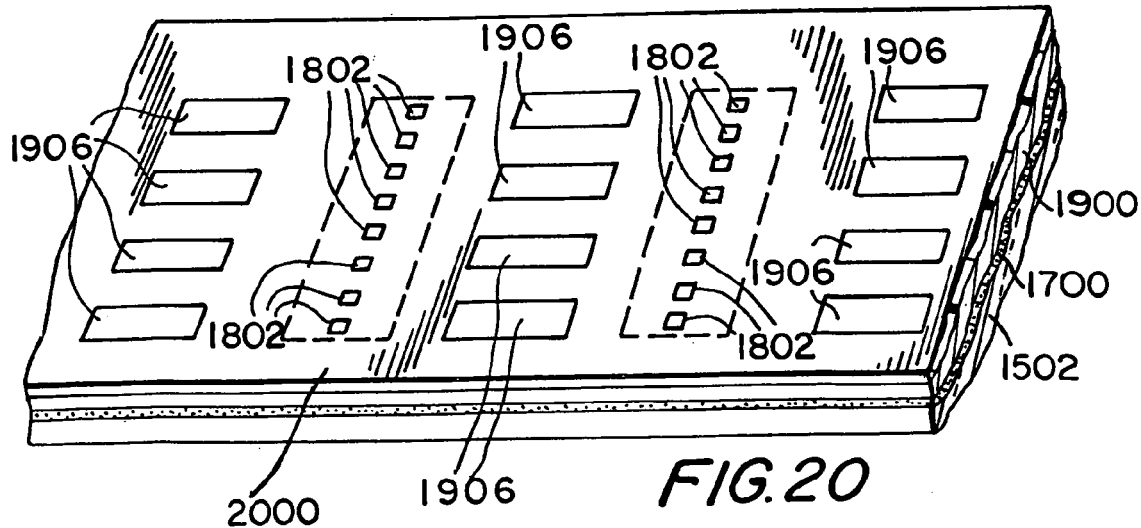
FIG. 20 illustrates a passivation interlayer deposited over the wafer of FIG. 15.

This is preferred because, as shown in FIG. 20, passivation interlayer 2000 is applied to protect chips 1800. Passivation interlayer 2000 may be made of, for example, BCB or polyimide. Passivation interlayer 2000 is deposited such that there are exposures at chip pads 1802 or exposures are created in passivation interlayer 2000 exposing chip pads 1802. Passivation interlayer 2000 is preferably deposited such that surfaces 1906 and the portions of passivation interlayer 2000 surrounding chip pads 1802 are substantially even. This ensures better electrical characteristics when blocks 1604 are coupled to the active circuit areas of chips 1800.

Figure 21:
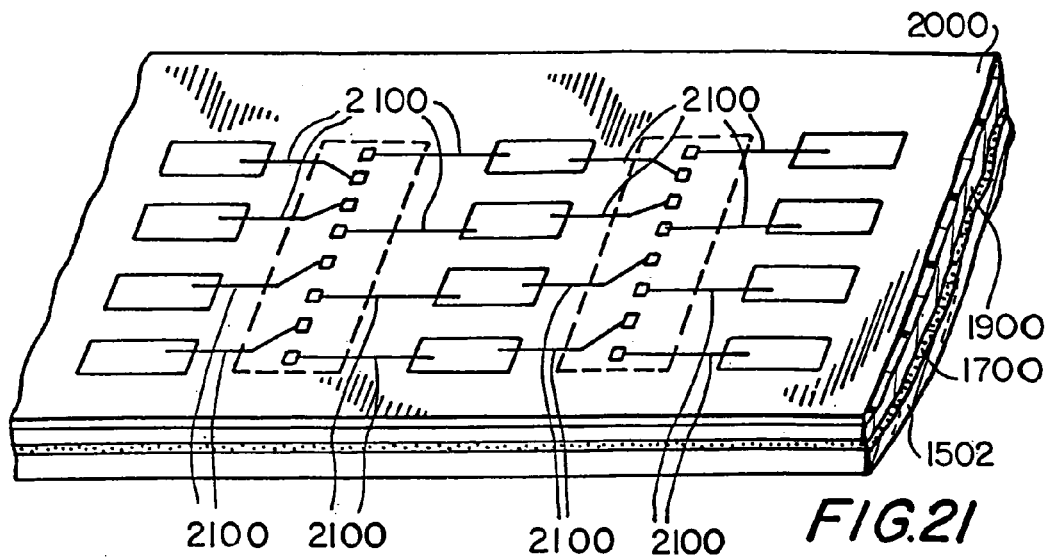
FIG. 21 illustrates conductors deposited between the surfaces of the castellation blocks and the chip pads of the chips of FIG. 18.

FIG. 21 shows metal contacts 2100 deposited and patterned on the packages to couple blocks 1604 to the active circuit areas of chips 1800. Metal contacts 2100 may be gold, aluminum, or any combination of the same.

Figure 22:
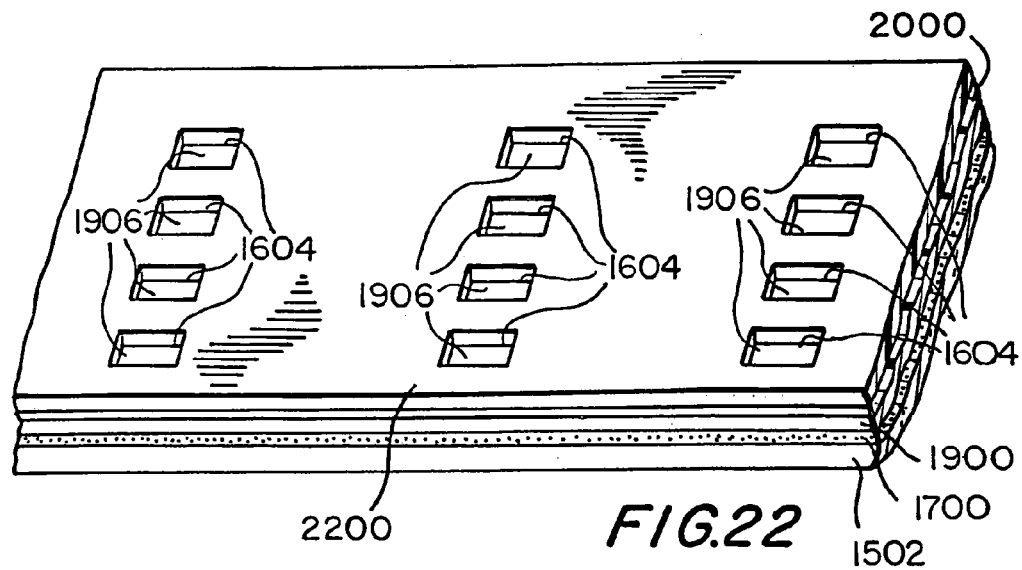
FIG. 22 illustrates a final passivation layer with exposures at the castellation blocks deposited over the wafer of FIG. 15.

FIG. 22 shows final passivation layer 2200 deposited over the packages. As shown, there are exposures in final passivation layer 2200 exposing surfaces 1906 of blocks 1604. Final passivation layer 2200 is deposited to protect the packages being fabricated and to ensure that electrical contact cannot be made directly to contacts 2100. Final passivation layer 2200 may be BCB or polyimide.

Figure 23:
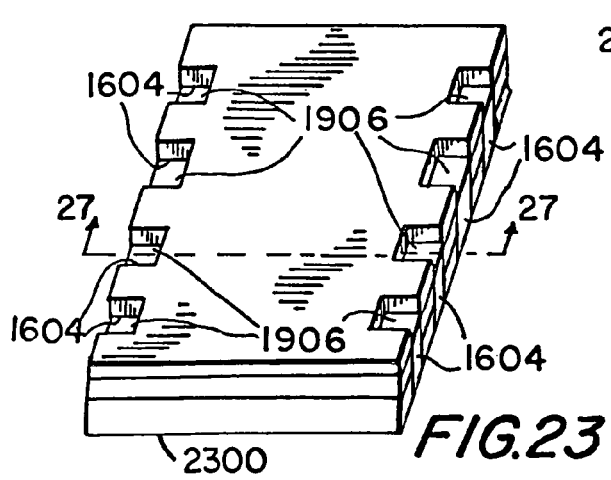
FIGS. 23 and 24 illustrate an individual package separated from the wafer of FIG. 15.

After depositing final passivation layer 2200, the devices being fabricated are separated into individual packages. Shown in FIG. 23 is an individual package 2300 resulting from the separation of the devices being fabricated. The devices are preferably sawed through at the midpoints of castellation blocks 1604. When the devices are sawed through, wafer portion 1502 is preferably partially sawed through. Any other method of separating the devices may also be used. Wafer portion 1502 is optionally thinned such that the bottoms of input/output pads 1500 are exposed. Wafer portion 1502 may be thinned prior to, or after, the devices are separated. The preferred result of the thinning and separation is that the bottoms of input/output pads 1500 are exposed.

Figure 24:
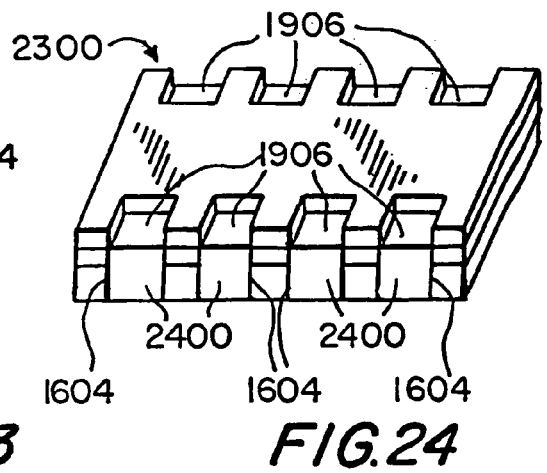
Figure 25:
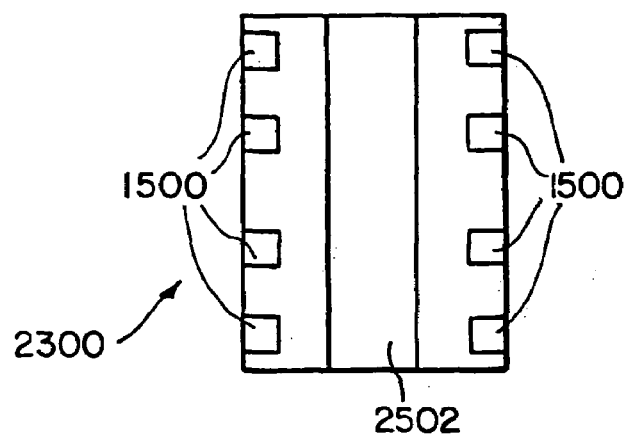
FIG. 25 illustrates the bottom of the package shown in FIGS. 23 and 24.

Illustrated in FIGS. 24 and 25 are side and bottom views, respectively, of an individual package 2300. Top surfaces 1906 and side surfaces 2400 of castellation blocks 1604 and the bottoms of input/output pads 1500 are exposed. Furthermore, substrate 2502 of chip 1800 may also be exposed.

Solder-wettable metal may be deposited on the exposed surfaces 1906 and 2400 of castellation blocks 1604 and on input/output pads 1500 to provide better solder joint reliability (not shown). This may be desirable in those embodiments in which packages 2300 will be stacked. Solder-wettable metal 1404 may be made of gold, tin, or any other suitable material that wets well to solder-paste prior to surface mount or solder prior to stacking. In those embodiments in which solder-wettable metal is deposited on castellation blocks 1604, other materials (e.g., under bump material) may be deposited on castellation blocks 1604 to provide better adhesion, buffering, and isolation. The materials may also act as a diffusion barrier.

In those embodiments in which packages 2300 are to be stacked, exposed surfaces 2400 of a first package 2300 are preferably coupled via, for example, solder to the respective input/output pads 1500 of a second package 2300. That is, when a first package 2300 is stacked on top of a second package 2300, the input/output pads 1500 of the second package 2300 are directly above and coupled to the exposed surfaces 1906 of the first package.

Figure 26:
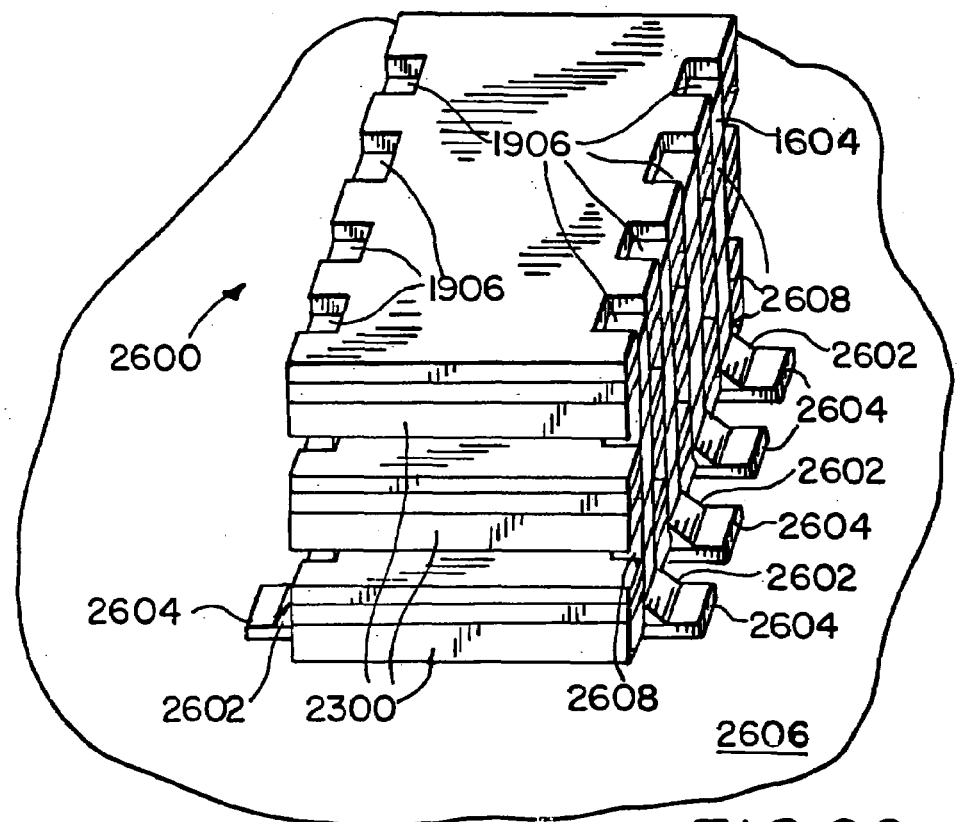
FIG. 26 illustrates several packages of FIG. 23 stacked on top of one another.

FIG. 26 illustrates three packages 2300 stacked on top of one another. Although device 2600 is illustrated with only three packages 2300 stacked on top of one another, other numbers of packages 2300 may be stacked. One limitation may be the electrical characteristics (e.g., resistance) of input/output pads 1500, solder 2608, blocks 1604, etc. and the physical limitations of the end product in which device 2600 is to be used.

The input/output pads 1500 of the bottom-most package 2300 are soldered with solder 2602 to, for example, pads 2604. Pads 2604 are coupled to, for example, motherboard 2606. Motherboard 2606 may have conductors coupling packages 2300 to, for example, a processor or some other device that may write data to or read data from chips 1800 packaged in packages 2300.

Other than the input/output pads 1500 of the bottom-most package 2300, input/output pads 1500 of a first package 2300 are coupled by solder 2608 to the respective surfaces 1906 of the castellation blocks 1504 of a second package 2300 directly below the first package 2300. This arrangement couples together the respective castellation blocks 1604 of packages 2300. Thus, a signal applied to one active circuit area of one castellation block 1604 of one package 2300 is applied to the respective castellation block 1604 of all the stacked packages 2300.

Similar to the embodiment of FIGS. 3-14, data may be written to and read from the active circuit areas of chips 1800 packaged in packages 2300 if that chip 1800 is activated. As is the case with device 1000 (FIG. 10), a simple way to activate a packaged chip 1800 is to apply an activation signal to a dedicated castellation block 1604 for that particular chip 1800. For example, a high signal may be applied to the dedicated castellation block 1604 for a package 2300 to activate a packaged chip 1800. The high signal on those castellation blocks 1604 of the other packages 2300 not including the chip 1800 to be activated preferably has no effect such that those other packages 2300 are not activated.

In another embodiment, all of the stacked packages 2600 have the same respective castellation block 1604 for receiving activation signals. A "code" or "key" signal may be applied to the dedicated castellation blocks 1604 (i.e., the respective castellation blocks 1604 of each package 2300). Preferably only one of the chips 1800 packaged in the stacked packages 2300 will respond (i.e., be activated or de-activated) by the code or key signal.

In still another embodiment, activation signals are applied to more than one group of castellation blocks 1604. In this embodiment, a binary code of high and low activation signals activate a particular chip 1800. For example, a high signal on a first castellation block 1604 and a low signal on a second castellation block 1604 may activate (or de-activate) a chip 1800 programmed to respond to these signals.

The above examples are merely exemplary. Chips 1800 packaged in stacked packages 2300 according to the invention may be activated, de-activated, written to, and read from in other ways.

Figure 27:
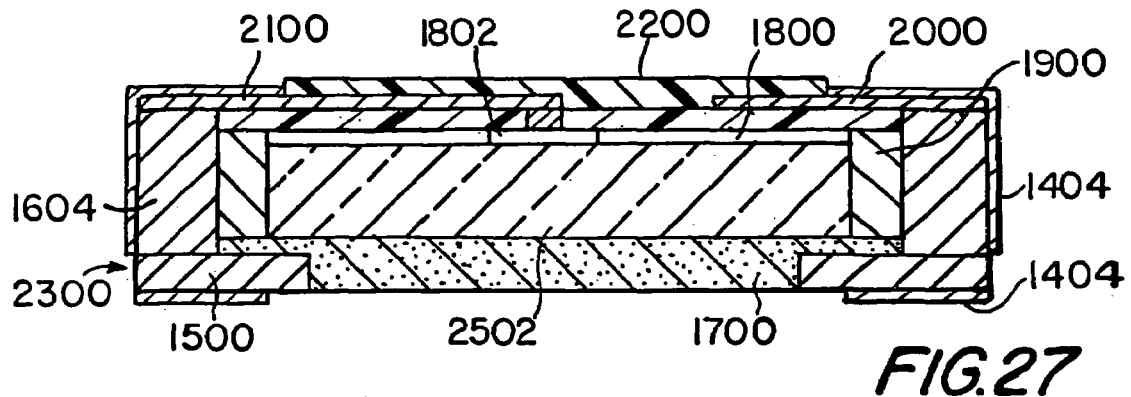
FIGS. 27-29 illustrate exemplary cross-sectional views of the package shown in FIGS. 23 and 24 taken along line 27-27 of FIG. 23.
Figure 28:
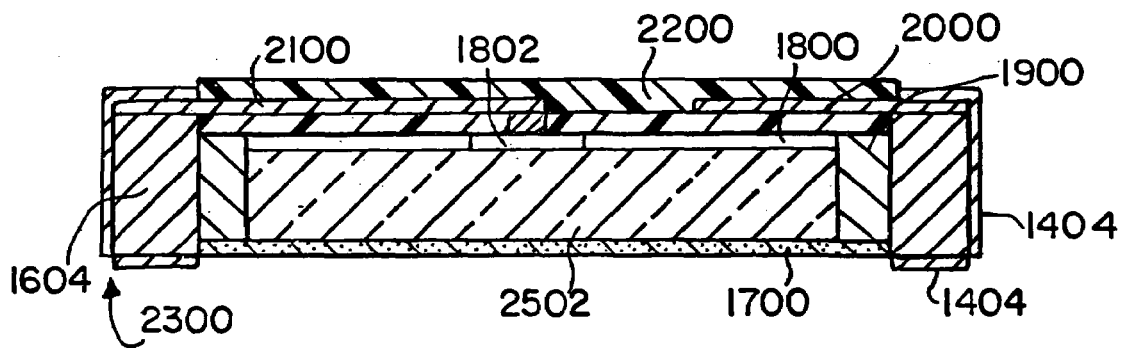
Figure 29:
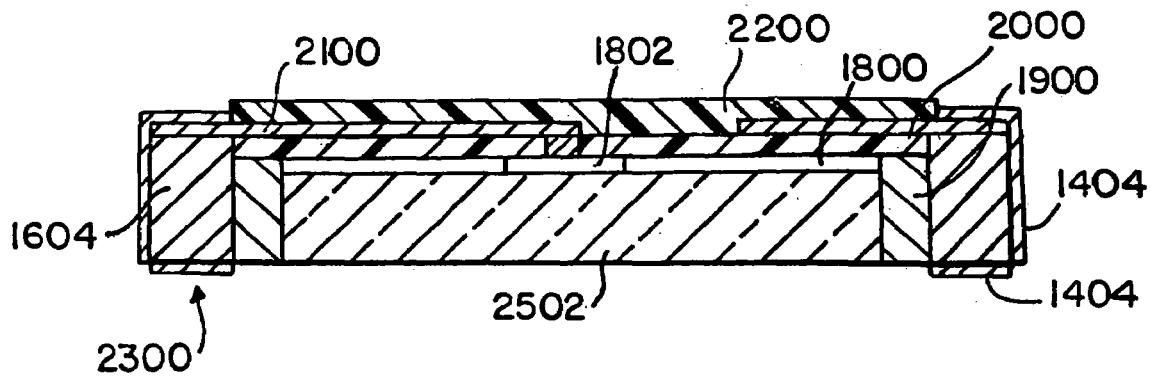

FIGS. 27-29 show exemplary cross-sectional views of packages 2300 through a chip pad 1802 taken along line 27-27 shown in FIG. 23. The cross-sectional views illustrate input/output pads 1500 (where present), castellation blocks 1604, wafer adhesive 1700 (where present), the active circuit areas of chips 1800, chip pads 1802, encapsulant 1900, passivation interlayer 2000, metal contacts 2100, final passivation layer 2200, substrate 2502. Also shown in FIGS. 27-29 is solder wettable metal 1404 coupled to castellation blocks 1604 and input/output pads 1500.

Figure 30:
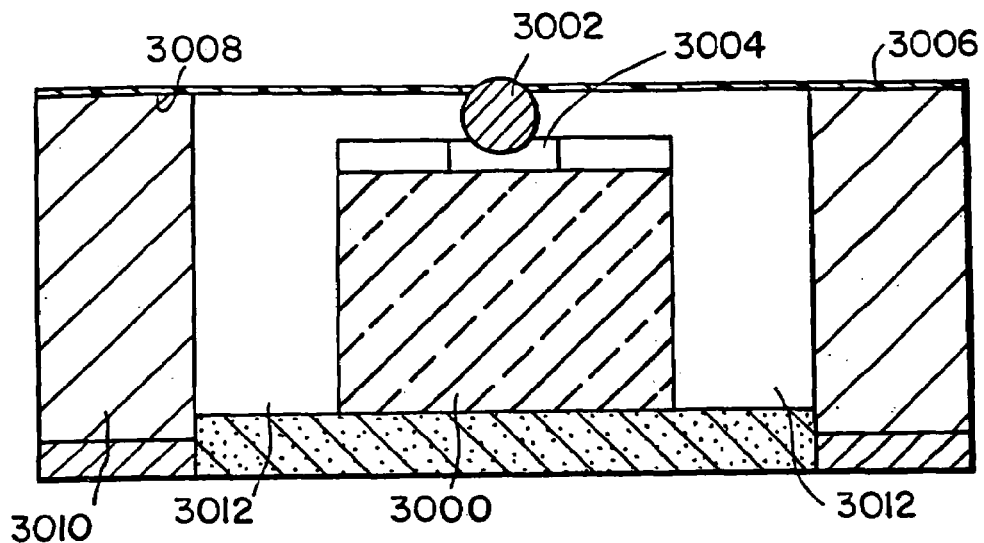
FIG. 30 illustrates an exemplary cross-sectional view of a package fabricated with film assisted molding techniques.

FIG. 30 shows an exemplary cross-sectional view of a package being fabricated using film assisted molding techniques. The process for fabricating these packages using these techniques is similar to that shown in connection with packages 2300 (i.e., the process illustrated in FIGS. 15-26). As illustrated in FIG. 30, integrated circuit chips 3000 are preferably pre-bumped such that a bump 3002 protrudes from the chip pad 3004. One technique for pre-bumping is stud bump bumping (SBB). Typically, gold is used for SBB. If desired, SBB may also be used in the processes to fabricate packages 2300.

Film 3006 is preferably placed over the device being fabricated such that bump 3002 is embedded into film 3006 and such that tops 3008 of castellation blocks 3010 are in contact with film 3006. By way of this arrangement, cavity 3012 is formed between chip 3000 and castellation blocks 3010. Cavity 3012 is then filled with a molding compound. When cavity 3012 is filled with the molding compound, the molding compound may be liquid or solid. The molding compound may be an epoxy molding compound, a liquid type epoxy, a liquid encapsulant, SU-8, and combinations thereof. Film 3006 is then removed when the molding compound is solid. When using film assisted molding techniques, the passivation interlayer may be unnecessary.

As a result of the molding process, only tops 3008 of castellation blocks 3010 and the top of bump 3002 will be exposed. Metal contacts are then deposited on the devices being fabricated to couple chip pad 3004 and castellation blocks 3010. The devices being fabricated are then preferably sawed through at the mid-points of castellation blocks 3010.

Figure 31:
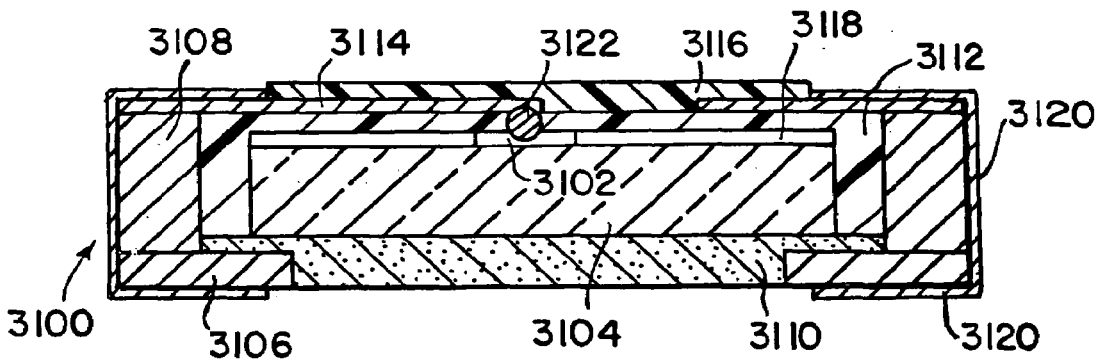
FIGS. 31-33 illustrate exemplary cross-sectional views of a package fabricated with film assisted molding techniques.
Figure 32:
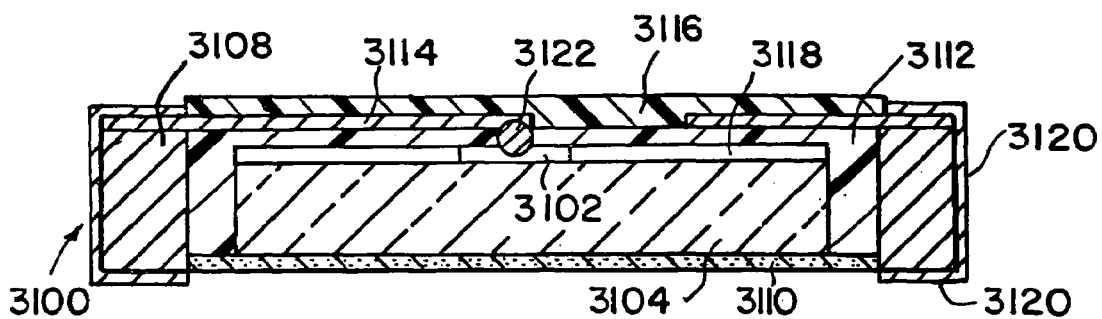
Figure 33:
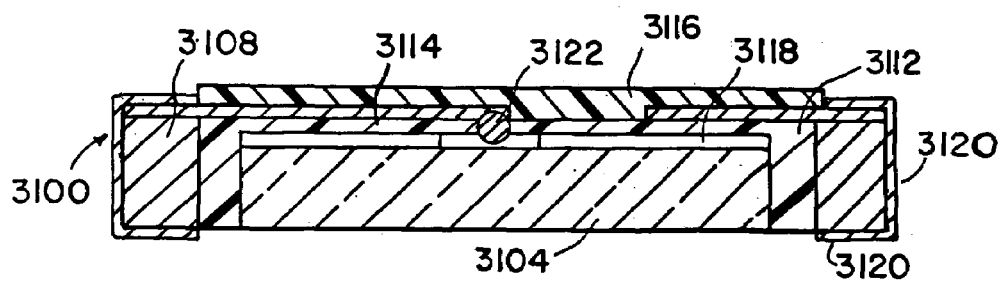

FIGS. 31-33 show exemplary cross-sectional views of packages 3100 taken through chip pad 3102 of a chip 3104. In these illustrative embodiments, packages 3100 were fabricated using film assisted molding techniques. The cross-sectional views illustrate input/output pads 3106, castellation blocks 3108, wafer adhesive 3110 (where present), molding compound 3112, metal contacts 3114, final passivation layer 3116, the active circuit areas 3118 of chips 3104, and bumps 3122. Also shown in FIGS. 31-33 is solder wettable metal 3120 coupled to castellation blocks 3108 and input/output pads 3106 (where present).

Figure 34:
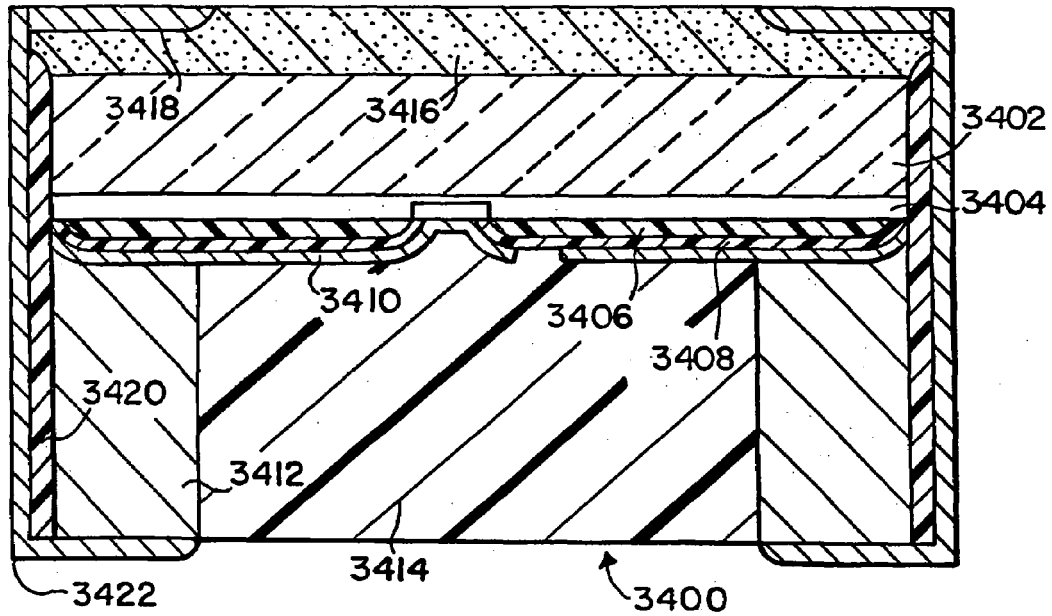
FIG. 34 illustrates an exemplary cross-sectional view of a third embodiment of integrated circuit chip packaging in accordance with the invention.

FIG. 34 shows an exemplary cross-sectional view of another package in accordance with the invention taken through a chip pad of a chip. The fabrication process of package 3400 begins similarly, if not identically, to the process shown in FIGS. 3-7. That is, a chip is fabricated on a first wafer. The active circuit areas of the chip are protected by a passivation layer. The bond pads of the chip are preferably exposed at the passivation layer. A passivation interlayer is preferably deposited over the passivation layer. Metal contacts are preferably deposited on the passivation interlayer and are also preferably coupled to the active circuit areas of the chip (e.g., at the bond pads). Castellation blocks are deposited on top of portions of the metal contacts. The castellation blocks are then encapsulated by an encapsulant.

In accordance with this embodiment of the invention, after the castellation blocks are encapsulated, a second wafer with input/output pads previously deposited on the wafer is bonded to the bottom of the first wafer (i.e., the side of the wafer on which the metal contacts, castellation blocks, etc. were not deposited). The first and second wafers may be bonded using a wafer adhesive. The input/output pads preferably have the same width and depth dimensions as the castellation blocks and are preferably deposited on the second wafer such that when the first and second wafers are bonded to one another the input/output pads are directly below the castellation blocks.

After the two wafers are bonded to one another, first trenches are cut (e.g., etched) through the castellation blocks, the first wafer, and a portion of the wafer adhesive. The input/output pads are preferably not exposed by these trenches. The first trenches are then preferably filled with a dielectric material.

Once the first trenches are filled, the first trenches are cut to form second trenches that expose the input/output pads. When the second trenches are formed, portions of the dielectric material are preferably left at the edges of the castellation blocks. Once the second trenches are formed, metal is deposited on the inside walls of the second trenches to electrically couple the castellation blocks to the input/output pads. The second wafer is then grinded away or thinned resulting in an individual package with respective input/output pads and castellation blocks coupled to one another. Packages fabricated using these processes may be stacked on top of one another. In addition, the packages may be used as leadless chip carriers. The silicon backsides of these packages are also insulated. When stacked or used as a leadless chip carrier, the chips in these packages may face down as shown in FIG. 34 or may face up.

Package 3400 includes first wafer portion 3402, the active circuit areas of chip 3404, passivation layer 3406, passivation interlayer 3408, metal contacts 3410, castellation blocks 3412, encapsulant 3414, wafer adhesive 3416, input/output pads 3418, trench dielectric 3420, and trench metal 3422.

Figure 35:
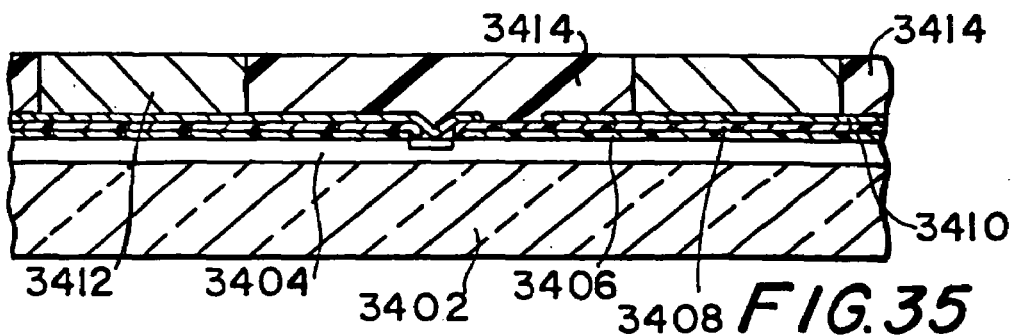
FIGS. 35-40 illustrate exemplary cross-sectional views of the package of FIG. 34 in various stages of fabrication.
Figure 36:
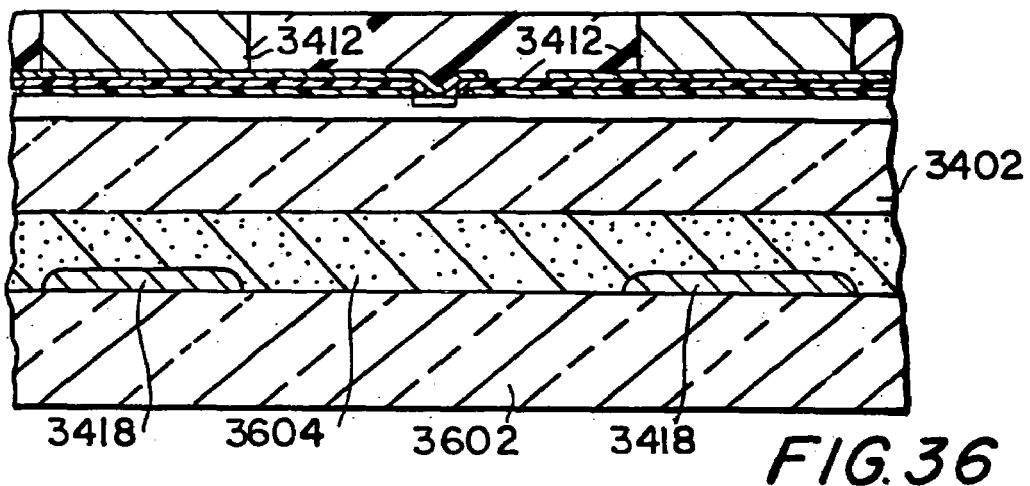

Illustrated in FIG. 35 is chip 3404, first wafer portion 3402, passivation layer 3406, passivation interlayer 3408, metal contacts 3410, castellation blocks 3412, and encapsulant 3414. FIG. 36 shows second wafer portion 3602 with input/output pads 3418 bonded to first wafer portion 3402 with wafer adhesive 3604. Second wafer portion 3602 is preferably bonded to first wafer portion 3402 such that input/output pads 3418 are directly below castellation blocks 3412.

Figure 37:
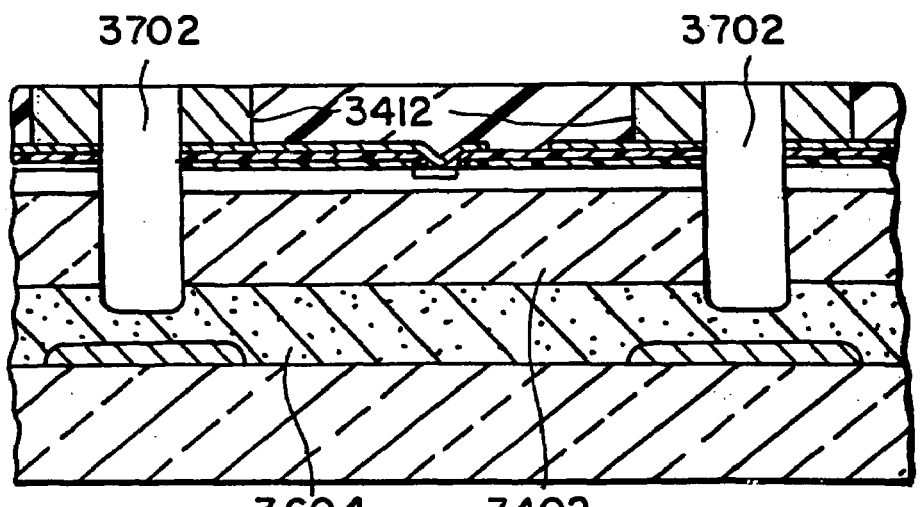
Figure 38:
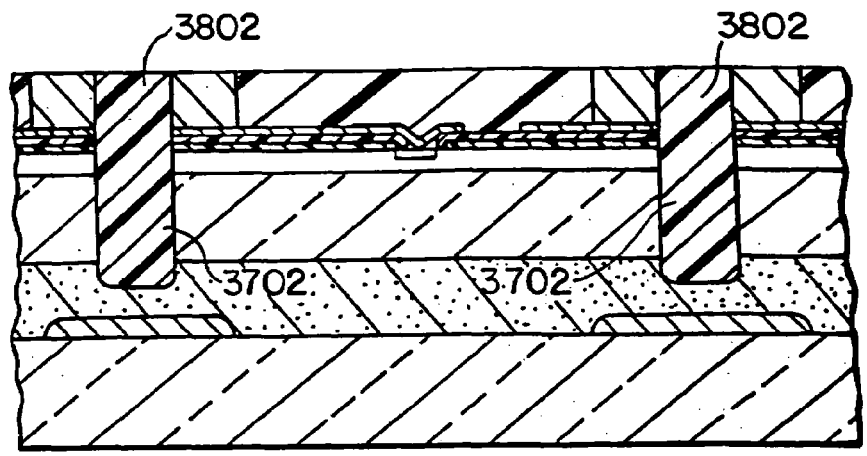

As shown in FIG. 37, first trenches 3702 are cut (e.g., etched) into the devices being fabricated such that portions of castellation blocks 3412, first wafer portion 3402, and wafer adhesive 3604 are removed. First trenches 3702 are preferably cut such that input/output pads 3418 are not exposed. First trenches 3702 are then preferably filled with a dielectric such as BCB. FIG. 38 shows trenches 3702 filled with trench dielectric 3802.

Figure 39:
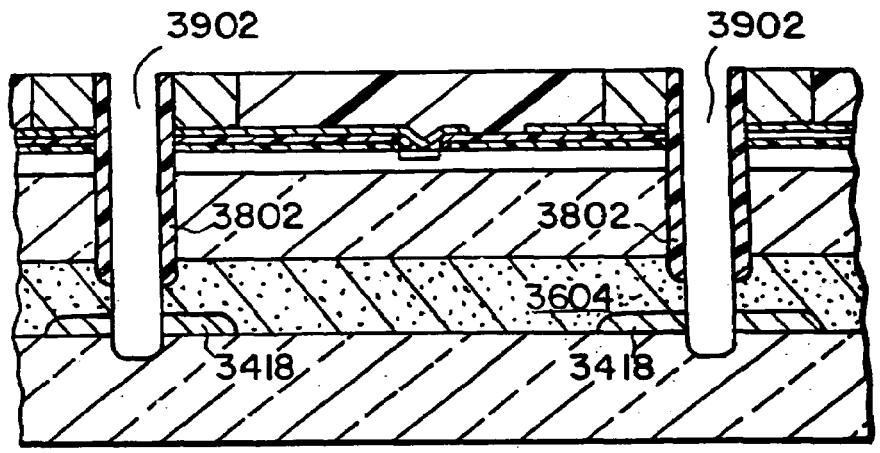
Figure 40:
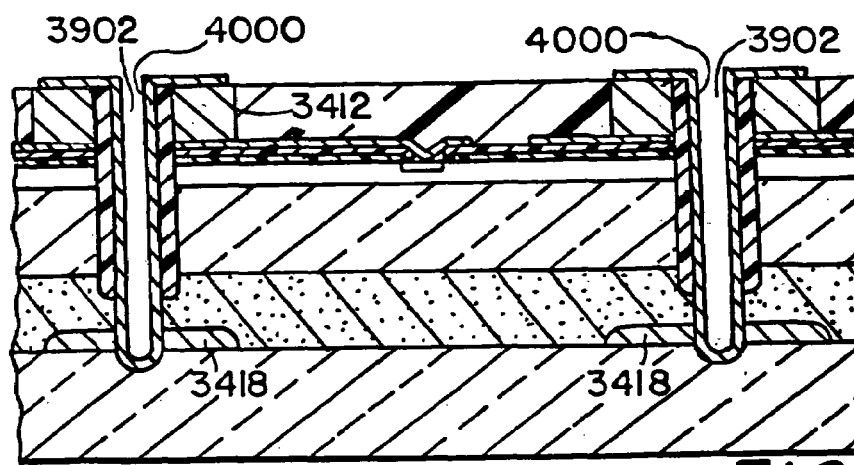

FIG. 39 illustrates second trenches 3902 cut into the devices being fabricated such that portions of trench dielectric 3802, wafer adhesive 3604, and input/output pads 3418 are removed. FIG. 40 shows trench metal 4000 deposited on the inside of trenches 3902 and on the tops of castellation blocks 3412 such that input/output pads 3418 and castellation blocks 3412 are coupled to one another. Once trench metal 4000 is deposited, second wafer portion 3602 is grinded away or thinned to the bottoms of input/output pads 3418 (this is not shown).

The result is individual packages with exposed input/output pads that are coupled to castellation blocks. Such a package is shown in FIG. 34.

The packages of the invention may be used for sensing. Stated in other words, the packages of the invention may be used as sensing devices. The packages may be used as image sensors, pressure sensors, chemical/gas sensors, or any other suitable type of sensor. The sensors may be MEMS sensors or a membrane type sensor.

Figure 41:
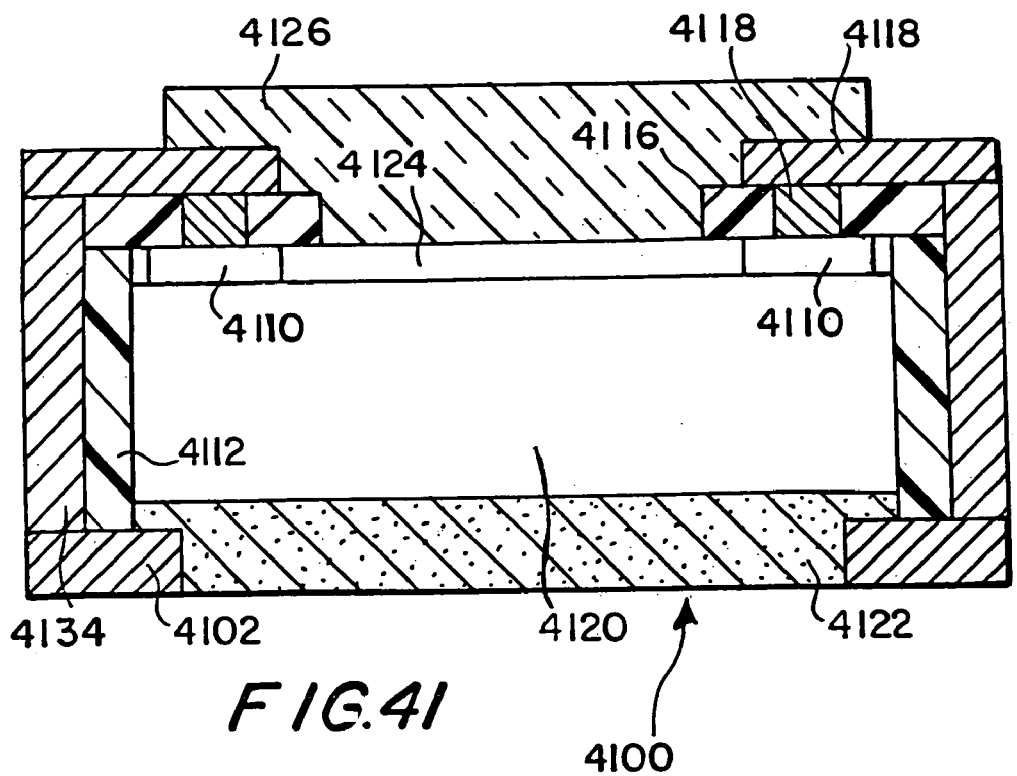
FIG. 41 illustrates a cross-sectional view of a photo-sensitive package.

FIG. 41 shows a cross-sectional view of an exemplary package 4100 that may be used for image sensing. Package 4100 includes input/output pads 4102, castellation blocks 4104, chip 4120, chip pads 4110, encapsulant 4112, passivation interlayer 4116, metal contacts 4118, and wafer adhesive 4122. Package 4100 also includes photo-sensors 4124 and lens/optical endcap 4126.

Lens/optical endcap 4126 may concentrate (e.g., focus) light (e.g., infrared light, ultra-violet light) on photo-sensors 4124. Chip 4120 may transmit signals (via chip pads 4110, metal contacts 4118, castellation blocks 4104, and input/ output pads 4102) to other chips or, for example, a motherboard in response to receiving an optical signal at photosensor 4124.

Packages such as packages 4100 that include photo-sensors 4124 are preferably deposited such that light may enter lens/optical endcaps 4126. That is, these packages are preferably deposited on, for example, a motherboard or a stack of packages such that they are face up (i.e., active circuit face of chip).

Figure 42:
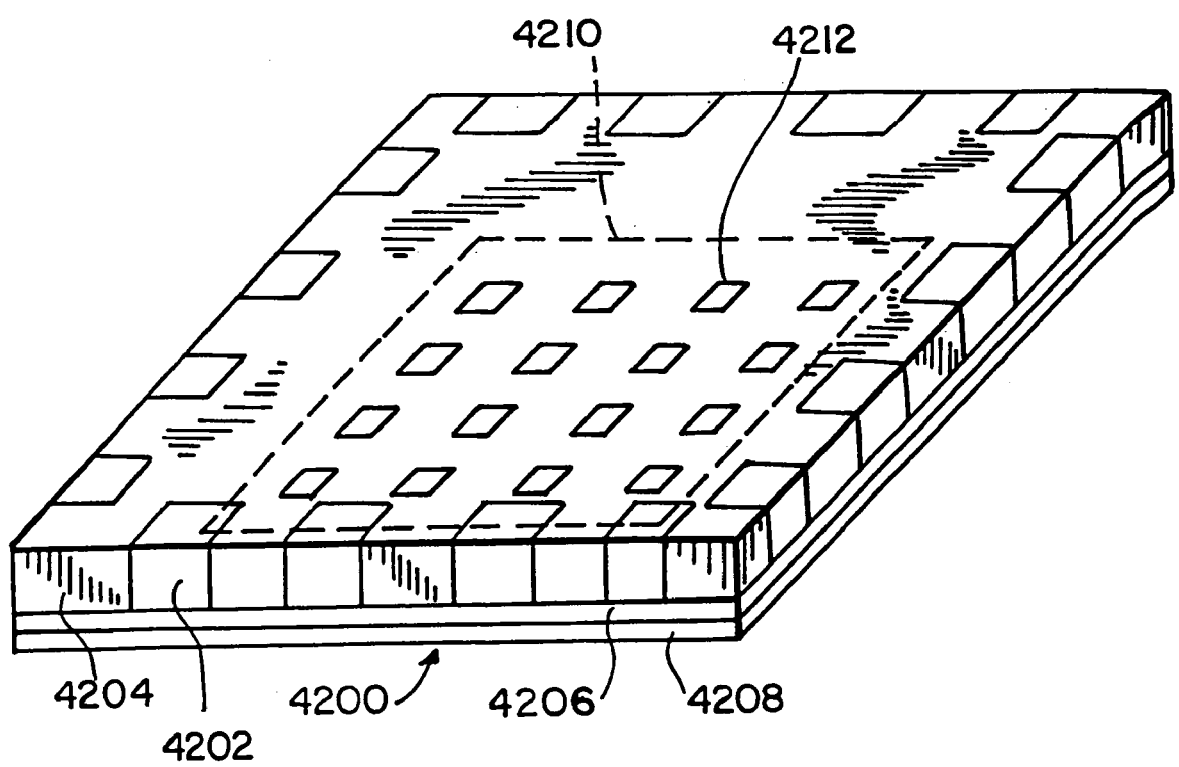
FIG. 42 illustrates an alternative package with castellation blocks on more than two sides.

FIG. 42 shows an alternative package with castellation blocks on more than two sides. Package 4200 includes castellation blocks 4202 and encapsulant 4204 deposited over wafer portion 4206. Back passivation layer 4208 protects package 4200. Also shown in FIG. 42 is chip 4210 embedded in package 4200. Chip 4210 has multiple chip pads 4212 arranged in rows and columns. Chip pads 4212 may be arranged in any suitable way. Packages such as packages 2300 may also have castellation blocks on more than two sides. Furthermore, packages such as packages 2300 may also have chip pads arranged in any suitable way such as rows and columns.

Figure 43:
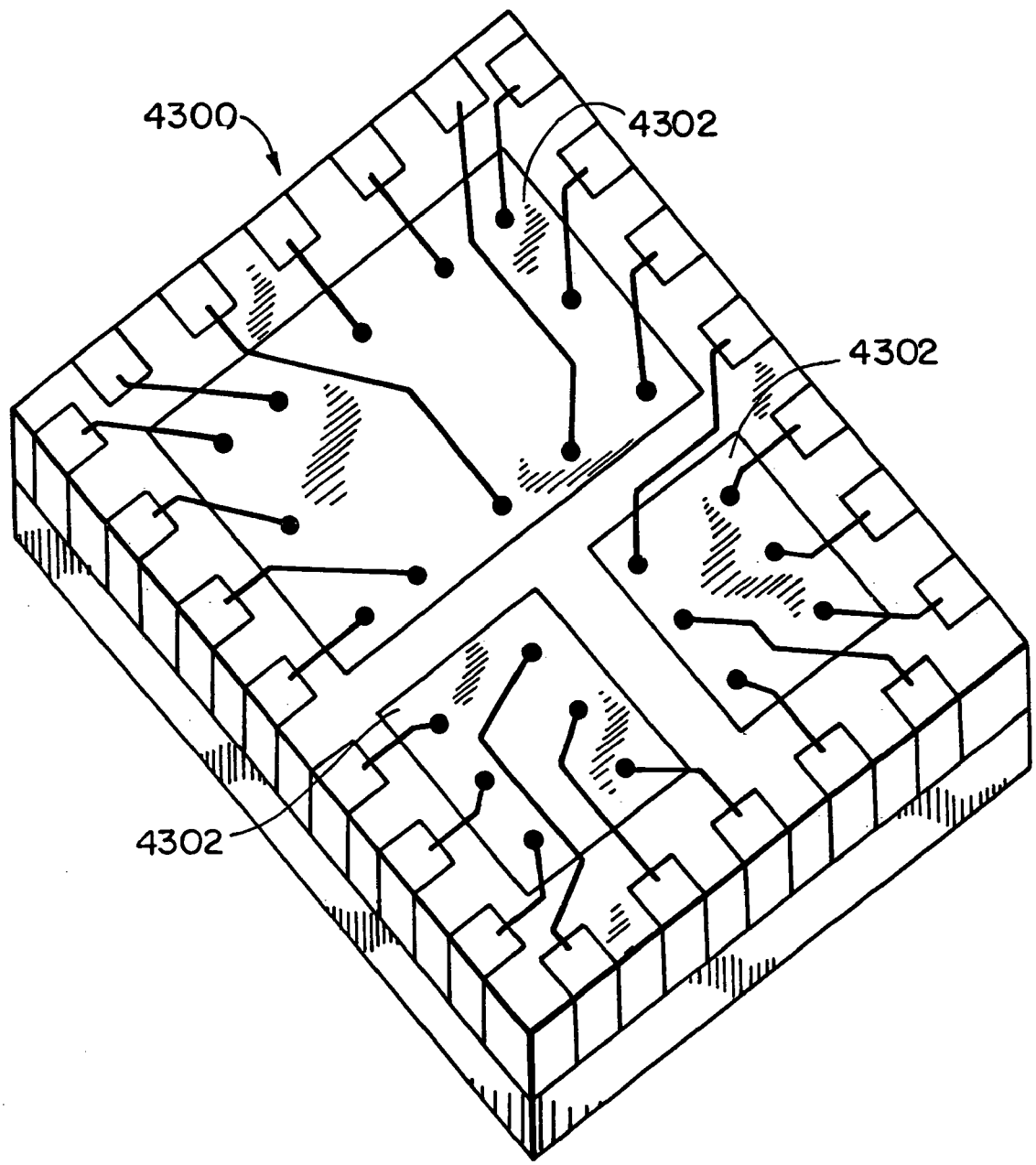
FIG. 43 illustrates multiple chips packaged in a System-in-Package.

The systems and methods for packaging integrated circuit chips in castellation wafer packaging may be used for packaging more than one chip in one package. For example, the systems and methods may be used to fabricate a System-in-Package (SiP). FIG. 43 illustrates an exemplary SiP 4300. As illustrated, several chips 4302 are packaged in SiP 4300. SiP 4300 may include a microcontroller, memory, a peripheral device, and any other suitable device. Chips 4302 included in SiP 4300 are preferably in communication with one another.

Thus it is seen that systems and methods for packaging integrated circuit chips in castellation wafer packaging are provided. One skilled in the art will appreciate that the invention can be practiced by other than the described embodiments, which are presented for purposes of illustration and not of limitation, and the invention is limited only by the claims which follow.

We claim:

1. Castellation wafer level packaging for packaging an integrated circuit chip, said packaging comprising:
   an integrated circuit chip having active circuit areas having a top surface;
   at least one active circuit area contact, each of the at least one active circuit area contacts coupled to an active circuit area;
   a passivation layer having a top surface formed on the top surface of the active circuit areas, wherein the passivation layer encapsulates the at least one active circuit area contact such that a top surface of the at least one active circuit area contact is exposed; and
   at least one castellation contact formed on the top surface of the passivation layer and that extends normal to the top surface of the passivation layer, each of the at least one castellation contacts coupled to an active circuit area contact, wherein each of the at least one castellation contacts is (a) large enough to be electrically coupled to solder, anisotropic conductive film, or anisotropic conductive paste, and (b) substantially encapsulated by a material such that no top surface of the castellation contact is encapsulated, wherein the at least one castellation contact is in direct contact with the material, and wherein the material is different from the passivation layer.

2. The packaging of claim 1 wherein the at least one active circuit area contacts are selected from the group consisting of aluminum, copper, under bump material, and combinations thereof.

3. The packaging of claim 1 wherein the at least one castellation contacts are selected from the group consisting of aluminum, copper, under bump material, and combinations thereof.

4. The packaging of claim 1 wherein the material is selected from the group consisting of an epoxy molding compound, a liquid type epoxy, a liquid encapsulant, SU-8, and combinations thereof.

5. The packaging of claim 1 wherein the at least one active circuit area contacts and the at least one castellation contacts are coupled with respective at least one tie contacts.

6. The packaging of claim 1 wherein:
   the at least one active circuit area contact is other than under bump material; and
   under bump material is deposited on the at least one active circuit area contact.

7. The packaging of claim 1 wherein the integrated circuit chip is adapted to be written to and read from.

8. The packaging of claim 7 wherein information is written to or read from the integrated circuit chip when the chip is activated.

9. The packaging of claim 8 wherein the chip is adapted to be activated in response to an activation signal.

10. The packaging of claim 9 wherein the activation signal is a "code" or "key" signal.

11. The packaging of claim 9 wherein the activation signal is applied to at least one castellation contact.

12. The packaging of claim 9 wherein the activation signal is a signal selected from the group consisting of a binary code, an analog signal, and combinations thereof.

13. The packaging of claim 1 wherein the integrated circuit chip is coupled to a device that can write information to and read information from the chip.

14. The packaging of claim 13 wherein the device is a motherboard.

15. The packaging of claim 13 wherein the device is coupled to the chip via a motherboard.

16. The packaging of claim 1 wherein the integrated circuit chip is coupled to a sensor selected from the group consisting of photo-sensors, pressure sensors, chemical/gas sensors, and combinations thereof.

17. The packaging of claim 16 wherein the sensor is a photo-sensor, the packaging further comprising a lens/optical endcap to focus light on the photo-sensor.

18. The packaging of claim 16 wherein the photo-sensor is adapted to generate signals in response to sensing light.

19. The packaging of claim 18 wherein the light is infrared light or ultra-violet light.

20. The packaging of claim 1 further comprising wherein at least one input/output pad coupled to the at least one castellation contact.

21. The packaging of claim 1 wherein the at least one castellation contact is coupled to a printed circuit board.

22. The packaging of claim 21 wherein the printed circuit board has at least one circuit board contact printed on a face of the board, and wherein the at least one castellation contact of the packaging is coupled to respective at least one circuit board contacts.

* * * * *

UNITED STATES PATENT AND TRADEMARK OFFICE
CERTIFICATE OF CORRECTION

PATENT NO. : 7,528,477 B2  Page 1 of 1
APPLICATION NO. : 11/221539
DATED : May 5, 2009
INVENTOR(S) : Jeung et al.

It is certified that error appears in the above-identified patent and that said Letters Patent is hereby corrected as shown below:

In column 16, line 53, in claim 20, after "comprising" delete "wherein".

Signed and Sealed this

Eleventh Day of August, 2009

David J. Kappos
*Director of the United States Patent and Trademark Office*